US010651972B2

(12) United States Patent
Wang et al.

(10) Patent No.: US 10,651,972 B2
(45) Date of Patent: May 12, 2020

(54) ADJUSTED FRACTALLY ENHANCED KERNEL POLAR CODES FOR ACHIEVABLE SIGNAL-TO-NOISE RATIO SPIKE MITIGATION

(71) Applicant: QUALCOMM Incorporated, San Diego, CA (US)

(72) Inventors: Ying Wang, San Diego, CA (US); Jing Jiang, San Diego, CA (US); Yang Yang, San Diego, CA (US); Wei Yang, San Diego, CA (US); Gabi Sarkis, San Diego, CA (US); Joseph Binamira Soriaga, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 3 days.

(21) Appl. No.: 16/180,795

(22) Filed: Nov. 5, 2018

(65) Prior Publication Data

US 2019/0181979 A1  Jun. 13, 2019

Related U.S. Application Data

(60) Provisional application No. 62/597,255, filed on Dec. 11, 2017.

(51) Int. Cl.
*H04L 1/00* (2006.01)
*H03M 13/00* (2006.01)
(Continued)

(52) U.S. Cl.
CPC .......... *H04L 1/0057* (2013.01); *H03M 13/13* (2013.01); *H03M 13/251* (2013.01);
(Continued)

(58) Field of Classification Search
CPC ... H04L 1/0057; H04L 1/0041; H04L 1/0068; H03M 13/13; H03M 13/251; H03M 13/618; H03M 13/6362
See application file for complete search history.

(56) References Cited

U.S. PATENT DOCUMENTS

| 2018/0048418 A1* | 2/2018 | Ge ......................... H04L 1/0038 |
| 2018/0278389 A1* | 9/2018 | Hamelin ............... H04L 1/0009 |
| 2018/0323905 A1* | 11/2018 | Shelby ................ H03M 13/033 |

OTHER PUBLICATIONS

Koike-Akino, T., et al., "Bit-Interleaved Polar-Coded OFDM for Low-Latency M2M Wireless Communications," 2017 IEEE International Conference on Communications (ICC), Conference Location: Paris, France, Date of Conference: May 21-25, 2017, pp. 1-7. (Year: 2017).*

(Continued)

*Primary Examiner* — Kyle Vallecillo
(74) *Attorney, Agent, or Firm* — Holland & Hart LLP

(57) ABSTRACT

Methods, systems, and devices for wireless communications are described. In some systems, wireless devices may implement adjusted fractally enhanced kernel polar coding. An encoder may receive a number of information bits and a block size for transmission, and may append an additional number of information bits to the information bits for transmission. The encoder may perform a recursive bit allocation process to allocate the aggregate set of information bits between a set of sub-blocks based on mutual information metrics. To obtain the correct number of information bits and block size, the encoder may remove a number of information bits equal to the number of appended additional bits (e.g., from a first half of the sub-blocks), assign the remaining information bits to bit channels in each sub-block, and block puncture a set of bits (e.g., from the first half). The resulting codeword may mitigate occurrences of achievable signal-to-noise ratio (SNR) spikes.

60 Claims, 18 Drawing Sheets

(51) Int. Cl.
H03M 13/25 (2006.01)
H03M 13/13 (2006.01)
(52) U.S. Cl.
CPC ..... *H03M 13/618* (2013.01); *H03M 13/6362* (2013.01); *H04L 1/0041* (2013.01); *H04L 1/0068* (2013.01)

(56) References Cited

OTHER PUBLICATIONS

Coherent Logix Inc: "Implementation Considerations for Polar Code Construction," 3GPP Draft; R1-1709134 Implementation Considerations for Polar Code Construction, 3rd Generation Partnership Project (3GPP), Mobile Competence Centre; 650, Route Des Lucioles; F-06921 Sophia-Antipol, vol. RAN WG1, No. Hangzhou, CN; May 15, 2017-May 19, 2017, May 14, 2017, XP051274290, 5 pages, Retrieved from the Internet: URL: http://www.3gpp.org/ftp/Meetings_3GPP_SYNC/RAN1/Docs/ [retrieved on May 14, 2017].
International Search Report and Written Opinion—PCT/US2018/059484—ISA/EPO—dated Jan. 25, 2019.
NEC: "Evaluation of Rate-matching Schemes for Polar Codes," 3GPP Draft; R1-1707058, 3rd Generation Partnership Project (3GPP), Mobile Competence Centre; 650, Route Des Lucioles; F-06921 Sophia-Antipolis Cedex; France, vol. RAN WG1, No. Hangzhou, China; May 15, 2017-May 19, 2017, May 14, 2017, XP051272287, 7 pages, Retrieved from the Internet: URL: http://www.3gpp.org/ftp/Meetings_3GPP_SYNC/RAN1/Docs/ [retrieved on May 14, 2017].
Qualcomm Incoporated: "FRANK Polar Construction for NR Control Channel and Performance Comparison," 3GPP Draft; R1-1709178 Frank Polar Construction for NR Control Channel and Performance Comparison, 3rd Generation Partnership Project (3GPP), Mobile Competence Centre; 650, Route Des Lucioles; F-069, vol. RAN WG1, No. Hangzhou; May 15, 2017-May 19, 2017, May 17, 2017, XP051285058, 28 pages, Retrieved from the Internet: URL: http://www.3gpp.org/ftp/tsg_ran/WG1_RL1/TSGR1_89/Docs/ [retrieved on May 17, 2017].
Qualcomm Incorporated: "Rate-matching Scheme for Polar Codes and Performance Evaluation," 3GPP Draft; R1-1708647 Rate-matching Scheme for Polar Codes and Performance Evaluation, 3rd Generation Partnership Project (3GPP), Mobile Competence Centre; 650, Route Des Lucioles; F-6921 SOPHIA-A, vol. RAN WG1, No. Hangzhou; May 15, 2017-May 19, 2017, May 14, 2017, XP051273834, 9 pages, Retrieved from the Internet: URL: http://www.3gpp.org/ftp/Meetings_3GPP_SYNC/RAN1/Docs/ [retrieved on May 14, 2017].

* cited by examiner

ADJUSTED FRACTALLY ENHANCED KERNEL POLAR CODES FOR ACHIEVABLE SIGNAL-TO-NOISE RATIO SPIKE MITIGATION

CROSS REFERENCES

The present application for patent claims the benefit of U.S. Provisional Patent Application No. 62/597,255 by WANG et al., entitled "ADJUSTED FRACTALLY ENHANCED KERNEL POLAR CODES FOR ACHIEVABLE SIGNAL-TO-NOISE RATIO SPIKE MITIGATION" filed Dec. 11, 2017, which is assigned to the assignee hereof and is expressly incorporated herein by reference in its entirety.

BACKGROUND

The following relates generally to wireless communication, and more specifically to adjusted fractally enhanced kernel polar codes for achievable signal-to-noise ratio (SNR) spike mitigation.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform-spread-OFDM (DFT-S-OFDM). A wireless multiple-access communications system may include a number of base stations or network access nodes, each simultaneously supporting communication for multiple communication devices, which may be otherwise known as user equipment (UE).

In some wireless communications systems, wireless devices may encode information bits using error-correcting codes, such as polar codes. Some encoders may implement fractally enhanced kernel polar code construction to generate a codeword for transmission. However, for some amounts of information bits and code block sizes, performing fractally enhanced kernel polar coding may result in a spike in achievable signal-to-noise ratio (SNR) curves for a wide range of coding rates. For example, if the encoder punctures a large number of bits (e.g., hundreds or thousands) to generate the specified code block size, the fractally enhanced kernel polar coding may incur a large performance loss (e.g., up to 0.5-1 decibel (dB) at a block error rate (BLER) of 1e−4).

SUMMARY

The described techniques relate to improved methods, systems, devices, or apparatuses that support adjusted fractally enhanced kernel polar codes for achievable signal-to-noise ratio (SNR) spike mitigation. Generally, the described techniques provide for a wireless device (e.g., a base station or user equipment (UE)) that may implement adjusted fractally enhanced kernel polar coding. An encoder of the wireless device may receive an amount of information bits for transmission within a specified block size, and may append an additional number of information bits to the information bits for transmission. Depending on the specified block size, the encoder may increase the number of bits for polar encoding with additional bits to be punctured later in the process. The encoder may then perform a recursive bit allocation procedure to polarize the channels and determine where to assign the information bits within the codeword. The recursive process may halt when the length of the sub-blocks is less than or equal to a threshold sub-block size. To obtain the specified number of information bits and the corresponding block size, the encoder may remove a number of information bits equal to the number of appended additional bits (e.g., from a first half of the sub-blocks). The encoder may then assign the information bits for transmission to information bit channels within each sub-block according to a pre-calculated bit sequence stored in memory for the threshold sub-block size. The encoder may perform block puncturing (e.g., in the first half of the sub-blocks) to reduce the codeword size back to the specified block size, and may transmit the resulting codeword.

A method of wireless communication is described. The method may include identifying a plurality of information bits including a number of bits for encoding, and determining an aggregate number of information bits for fractally enhanced kernel polar code construction, where the aggregate number of information bits is equal to a sum of the number of bits for encoding and an additional number of bits. The method may further include allocating a total number of information bit channels according to the fractally enhanced kernel polar code construction and the aggregate number of information bits, removing a number of allocated information bit channels from the total number of information bit channels to obtain a final set of allocated information bit channels, where the number of removed allocated information bit channels is equal to the additional number of bits, generating a polar-encoded codeword based on assigning the plurality of information bits to the final set of allocated information bit channels, and transmitting the polar-encoded codeword.

An apparatus for wireless communication is described. The apparatus may include means for identifying a plurality of information bits including a number of bits for encoding, and means for determining an aggregate number of information bits for fractally enhanced kernel polar code construction, where the aggregate number of information bits is equal to a sum of the number of bits for encoding and an additional number of bits. The apparatus may further include means for allocating a total number of information bit channels according to the fractally enhanced kernel polar code construction and the aggregate number of information bits, means for removing a number of allocated information bit channels from the total number of information bit channels to obtain a final set of allocated information bit channels, where the number of removed allocated information bit channels is equal to the additional number of bits, means for generating a polar-encoded codeword based on assigning the plurality of information bits to the final set of allocated information bit channels, and means for transmitting the polar-encoded codeword.

Another apparatus for wireless communication is described. The apparatus may include a processor, memory in electronic communication with the processor, and instructions stored in the memory. The instructions may be operable to cause the processor to identify a plurality of information bits including a number of bits for encoding, and determine an aggregate number of information bits for fractally enhanced kernel polar code construction, where the aggregate number of information bits is equal to a sum of the number of bits for encoding and an additional number of bits. The instructions may be further operable to cause the processor to allocate a total number of information bit channels according to the fractally enhanced kernel polar code construction and the aggregate number of information bits, remove a number of allocated information bit channels from the total number of information bit channels to obtain a final set of allocated information bit channels, where the number of removed allocated information bit channels is equal to the additional number of bits, generate a polar-encoded codeword based on assigning the plurality of information bits to the final set of allocated information bit channels, and transmit the polar-encoded codeword.

A non-transitory computer-readable medium for wireless communication is described. The non-transitory computer-readable medium may include instructions operable to cause a processor to identify a plurality of information bits including a number of bits for encoding, and determine an aggregate number of information bits for fractally enhanced kernel polar code construction, where the aggregate number of information bits is equal to a sum of the number of bits for encoding and an additional number of bits. The instructions may be further operable to cause the processor to allocate a total number of information bit channels according to the fractally enhanced kernel polar code construction and the aggregate number of information bits, remove a number of allocated information bit channels from the total number of information bit channels to obtain a final set of allocated information bit channels, where the number of removed allocated information bit channels is equal to the additional number of bits, generate a polar-encoded codeword based on assigning the plurality of information bits to the final set of allocated information bit channels, and transmit the polar-encoded codeword.

Some examples of the method, apparatus, and non-transitory computer-readable medium described herein may further include processes, features, means, or instructions for identifying a block length for the fractally enhanced kernel polar code construction. Some examples of the method, apparatus, and non-transitory computer-readable medium described herein may further include processes, features, means, or instructions for determining a length of the polar-encoded codeword based on the block length.

Some examples of the method, apparatus, and non-transitory computer-readable medium described herein may further include processes, features, means, or instructions for puncturing one or more bits based on the block length and the length of the polar-encoded codeword.

In some examples of the method, apparatus, and non-transitory computer-readable medium described herein, allocating the total number of information bit channels may include recursively splitting the length of the polar-encoded codeword into a plurality of sub-blocks. Some examples of the method, apparatus, and non-transitory computer-readable medium described herein may further include processes, features, means, or instructions for assigning information bits of the aggregate number of information bits to the plurality of sub-blocks based on mutual information metrics. Some examples of the method, apparatus, and non-transitory computer-readable medium described herein may further include processes, features, means, or instructions for allocating the total number of information bit channels based on a number of information bits assigned to each sub-block of the plurality of sub-blocks.

Some examples of the method, apparatus, and non-transitory computer-readable medium described herein may further include processes, features, means, or instructions for dividing the plurality of sub-blocks into a first portion of sub-blocks and a second portion of sub-blocks, where the number of allocated information bit channels may be removed from the first portion of sub-blocks.

Some examples of the method, apparatus, and non-transitory computer-readable medium described herein may further include processes, features, means, or instructions for puncturing one or more bits from the first portion of sub-blocks, where the number of allocated information bit channels may be removed from the first portion of sub-blocks based on the puncturing.

Some examples of the method, apparatus, and non-transitory computer-readable medium described herein may further include processes, features, means, or instructions for calculating an average number of bit channels to remove based on the additional number of bits and a number of sub-blocks in the first portion of sub-blocks, where the number of allocated information bit channels may be removed from the first portion of sub-blocks based on the average number of bit channels to remove.

Some examples of the method, apparatus, and non-transitory computer-readable medium described herein may further include processes, features, means, or instructions for refraining from removing a last allocated information bit channel from a sub-block. In some examples of the method, apparatus, and non-transitory computer-readable medium described herein, the first portion of sub-blocks may be a first half of the plurality of sub-blocks and the second portion of sub-blocks may be a second half of the plurality of sub-blocks.

Some examples of the method, apparatus, and non-transitory computer-readable medium described herein may further include processes, features, means, or instructions for halting the recursive splitting when a sub-block length of each sub-block is less than or equal to a threshold sub-block length. In some examples of the method, apparatus, and non-transitory computer-readable medium described herein, each sub-block of the threshold sub-block length may include a pre-determined bit channel reliability order, where generating the polar-encoded codeword may include assigning the plurality of information bits based on the pre-determined bit channel reliability order and the number of information bits assigned to each sub-block of the plurality of sub-blocks.

Some examples of the method, apparatus, and non-transitory computer-readable medium described herein may further include processes, features, means, or instructions for selecting the additional number of bits based on a bit selection function. In some examples of the method, apparatus, and non-transitory computer-readable medium described herein, the bit selection function may be based on the block length, the length of the polar-encoded codeword, a number of punctured bits, or a combination thereof.

In some examples of the method, apparatus, and non-transitory computer-readable medium described herein, removing the number of allocated information bit channels may be based on channel capacity values, error probability values, or a combination thereof.

A further method of wireless communication is described. The method may include receiving a polar-encoded codeword including a plurality of encoded information bits, the polar-encoded codeword generated based on a fractally enhanced kernel polar code construction, and performing a decoding process on the polar-encoded codeword. The decoding process may include determining an aggregate number of information bits, where the aggregate number of information bits is equal to a sum of a number of bits of the plurality of encoded information bits and an additional number of bits, identifying allocated information bit channels according to the fractally enhanced kernel polar code construction and the aggregate number of information bits, removing a number of allocated information bit channels from the identified allocated information bit channels to obtain a final set of allocated information bit channels, where the number of removed allocated information bit channels is equal to the additional number of bits, and decoding the plurality of encoded information bits based on the final set of allocated information bit channels.

An apparatus for wireless communication is described. The apparatus may include means for receiving a polar-encoded codeword including a plurality of encoded information bits, the polar-encoded codeword generated based on a fractally enhanced kernel polar code construction, and means for performing a decoding process on the polar-encoded codeword. The means for performing the decoding process may include means for determining an aggregate number of information bits, where the aggregate number of information bits is equal to a sum of a number of bits of the plurality of encoded information bits and an additional number of bits, means for identifying allocated information bit channels according to the fractally enhanced kernel polar code construction and the aggregate number of information bits, means for removing a number of allocated information bit channels from the identified allocated information bit channels to obtain a final set of allocated information bit channels, where the number of removed allocated information bit channels is equal to the additional number of bits, and means for decoding the plurality of encoded information bits based on the final set of allocated information bit channels.

Another apparatus for wireless communication is described. The apparatus may include a processor, memory in electronic communication with the processor, and instructions stored in the memory. The instructions may be operable to cause the processor to receive a polar-encoded codeword including a plurality of encoded information bits, the polar-encoded codeword generated based on a fractally enhanced kernel polar code construction, and perform a decoding process on the polar-encoded codeword. The instructions operable to cause the processor to perform the decoding process may be further operable to cause the processor to determine an aggregate number of information bits, where the aggregate number of information bits is equal to a sum of a number of bits of the plurality of encoded information bits and an additional number of bits, identify allocated information bit channels according to the fractally enhanced kernel polar code construction and the aggregate number of information bits, remove a number of allocated information bit channels from the identified allocated information bit channels to obtain a final set of allocated information bit channels, where the number of removed allocated information bit channels is equal to the additional number of bits, and decode the plurality of encoded information bits based on the final set of allocated information bit channels.

A non-transitory computer-readable medium for wireless communication is described. The non-transitory computer-readable medium may include instructions operable to cause a processor to receive a polar-encoded codeword including a plurality of encoded information bits, the polar-encoded codeword generated based on a fractally enhanced kernel polar code construction, and perform a decoding process on the polar-encoded codeword. The instructions operable to cause the processor to perform the decoding process may be further operable to cause the processor to determine an aggregate number of information bits, where the aggregate number of information bits is equal to a sum of a number of bits of the plurality of encoded information bits and an additional number of bits, identify allocated information bit channels according to the fractally enhanced kernel polar code construction and the aggregate number of information bits, remove a number of allocated information bit channels from the identified allocated information bit channels to obtain a final set of allocated information bit channels, where the number of removed allocated information bit channels is equal to the additional number of bits, and decode the plurality of encoded information bits based on the final set of allocated information bit channels.

Some examples of the method, apparatus, and non-transitory computer-readable medium described herein may further include processes, features, means, or instructions for identifying a block length for the fractally enhanced kernel polar code construction and a length of the polar-encoded codeword. Some examples of the method, apparatus, and non-transitory computer-readable medium described herein may further include processes, features, means, or instructions for determining a number of punctured bits based on the block length and the length of the polar-encoded codeword.

Some examples of the method, apparatus, and non-transitory computer-readable medium described herein may further include processes, features, means, or instructions for determining the additional number of bits based on a bit selection function. In some examples of the method, apparatus, and non-transitory computer-readable medium described herein, the bit selection function may be based on the block length, the length of the polar-encoded codeword, a number of punctured bits, or a combination thereof.

In some examples of the method, apparatus, and non-transitory computer-readable medium described herein, identifying the allocated information bit channels includes recursively splitting a length of the polar-encoded codeword into a plurality of sub-blocks. Some examples of the method, apparatus, and non-transitory computer-readable medium described herein may further include processes, features, means, or instructions for determining assignments of information bits of the aggregate number of information bits to the plurality of sub-blocks based on mutual information metrics. Some examples of the method, apparatus, and non-transitory computer-readable medium described herein may further include processes, features, means, or instructions for identifying the allocated information bit channels based on a number of information bits assigned to each sub-block of the plurality of sub-blocks.

Some examples of the method, apparatus, and non-transitory computer-readable medium described herein may further include processes, features, means, or instructions for dividing the plurality of sub-blocks into a first portion of sub-blocks and a second portion of sub-blocks, where the number of allocated information bit channels may be removed from the first portion of sub-blocks.

Some examples of the method, apparatus, and non-transitory computer-readable medium described herein may further include processes, features, means, or instructions for identifying a set of punctured bits in the first portion of sub-blocks, where the number of allocated information bit channels may be removed from the first portion of sub-blocks based on the identified set of punctured bits.

Some examples of the method, apparatus, and non-transitory computer-readable medium described herein may further include processes, features, means, or instructions for calculating an average number of bit channels to remove based on the additional number of bits and a number of sub-blocks in the first portion of sub-blocks, where the number of allocated information bit channels may be removed from the first portion of sub-blocks based on the average number of bit channels to remove.

Some examples of the method, apparatus, and non-transitory computer-readable medium described herein may further include processes, features, means, or instructions for refraining from removing a last allocated information bit channel from a sub-block. In some examples of the method, apparatus, and non-transitory computer-readable medium described herein, the first portion of sub-blocks may be a first half of the plurality of sub-blocks and the second portion of sub-blocks may be a second half of the plurality of sub-blocks.

Some examples of the method, apparatus, and non-transitory computer-readable medium described herein may further include processes, features, means, or instructions for halting the recursive splitting when a sub-block length of each sub-block is less than or equal to a threshold sub-block length. In some examples of the method, apparatus, and non-transitory computer-readable medium described herein, each sub-block of the threshold sub-block length may include a pre-determined bit channel reliability order, where decoding the plurality of encoded information bits may include determining assignments for the plurality of encoded information bits based on the pre-determined bit channel reliability order and the number of information bits assigned to each sub-block of the plurality of sub-blocks.

In some examples of the method, apparatus, and non-transitory computer-readable medium described herein, removing the number of allocated information bit channels may be based on channel capacity values, error probability values, or a combination thereof.

DETAILED DESCRIPTION

Figure 1:
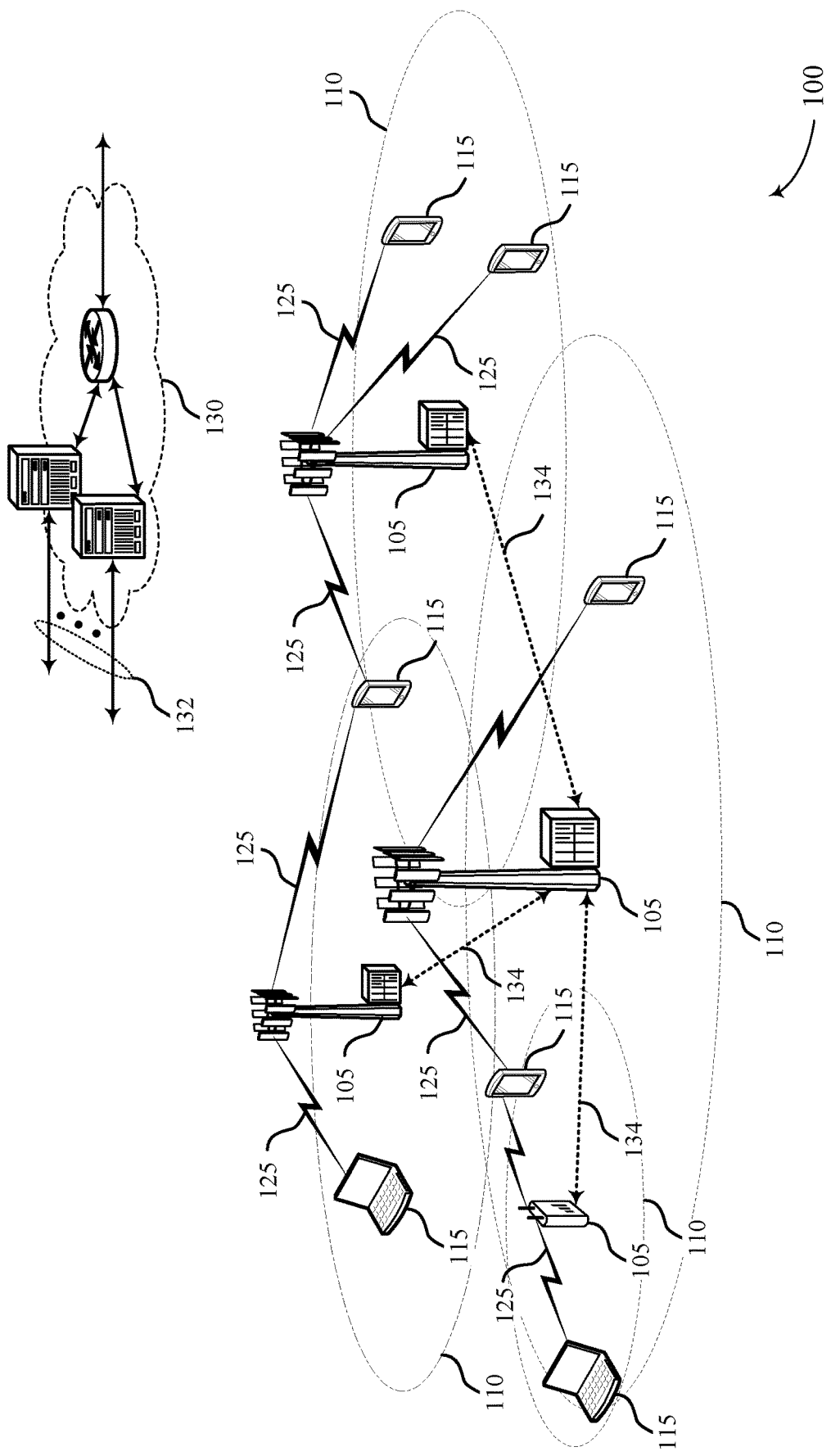
FIG. 1 illustrates an example of a system for wireless communication that supports adjusted fractally enhanced kernel polar codes for achievable signal-to-noise ratio (SNR) spike mitigation in accordance with aspects of the present disclosure.

In some wireless communications systems, wireless devices (e.g., base stations or user equipment (UEs)) may communicate using error-correcting codes, such as polar codes. To construct a polar-encoded codeword, the wireless device may use one or more encoding schemes. For example, the wireless device may implement a density evolution (DE) scheme for constructing a polar code, or may implement a fractally enhanced kernel polar code. In some cases, DE polar codes may support better performance than fractally enhanced kernel polar code across a wide range of coding rates and payload sizes, but may be more complex and resource intensive.

To improve the performance of fractally enhanced kernel polar codes without significantly increasing either the complexity or memory overhead, wireless devices may implement adjusted fractally enhanced kernel polar codes. To construct an adjusted fractally enhanced kernel polar code, a wireless device may determine a number of information bits to encode, as well as a block size to transmit. An encoder of the wireless device may adjust the number of information bits by selecting an additional number of bits and aggregating the information bits for encoding with the additional bits. Furthermore, the encoder may determine a codeword length that supports polar-encoding based on the block size. For example, the encoder may add a number of bits to the block size that may be punctured after encoding (e.g., so that the codeblock size is a power of 2 for polar-encoding).

The encoder may recursively split the codeword into sub-blocks, and may allocate the aggregate information bits to the different sub-blocks based on mutual information metrics. When the sub-blocks are less than or equal to a pre-determined threshold size, the encoder may halt the recursive process. The encoder may remove a number of allocated information bits equal to the selected additional number of information bits from one or more of the sub-blocks so that just the information bits for transmission are allocated within the sub-blocks. In some cases, the encoder may remove the information bits from the first half of the sub-blocks, may refrain from removing a last information bit from any sub-block, or both. Once the additional information bits are removed, the encoder may assign the remaining information bits to bit channels within each sub-block based on a reliability bit channel sequence stored in the memory of the encoder. The encoder may then perform block puncturing to reduce the codeword to the specified block size, and the wireless device may transmit the codeword. A receiving device may receive the codeword, and may decode the transmitted information bits based on a similar adapted fractally enhanced kernel polar coding process. By adjusting the fractally enhanced kernel polar code construction, the encoder may effectively shift information bits to bit channels later in the codeword with greater channel capacities, improving the reliability of the codeword and reducing or mitigating any spikes in the achievable signal-to-noise ratio (SNR) curve.

Aspects of the disclosure are initially described in the context of a wireless communications system. Additional aspects of the disclosure are described with reference to a device, adjusted fractally enhanced kernel polar code construction, adjusted information bit channel assignment, exemplary simulation results, and a process flow. Aspects of the disclosure are further illustrated by and described with reference to apparatus diagrams, system diagrams, and flowcharts that relate to adjusted fractally enhanced kernel polar codes for achievable SNR spike mitigation.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-A Pro network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation Node B or giga-nodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up only a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an Si or other interface). Base stations 105 may communicate with one another over backhaul links 134 (e.g., via an X2 or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 MHz to 300 GHz. Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that can tolerate interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a CA configuration in conjunction with CCs operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving devices are equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g. synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105. Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based on listening according to different receive beam directions (e.g., a beam direction determined to have a highest signal strength, highest signal-to-noise ratio, or otherwise acceptable signal quality based on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical (PHY) layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as $T_f=307,200$ $T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an E-UTRA absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as orthogonal frequency division multiplexing (OFDM) or DFT-s-OFDM).

The organizational structure of the carriers may be different for different radio access technologies (e.g., LTE, LTE-A, LTE-A Pro, NR). For example, communications over a carrier may be organized according to TTIs or slots, each of which may include user data as well as control information or signaling to support decoding the user data. A carrier may also include dedicated acquisition signaling (e.g., synchronization signals or system information) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs that can support simultaneous communications via carriers associated with more than one different carrier bandwidth.

Wireless communications system 100 may support communication with a UE 115 on multiple cells or carriers, a feature which may be referred to as carrier aggregation (CA) or multi-carrier operation. A UE 115 may be configured with multiple downlink CCs and one or more uplink CCs according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other CCs, which may include use of a reduced symbol duration as compared with symbol durations of the other CCs. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz) at reduced symbol durations (e.g., 16.67 microseconds). A TTI in eCC may consist of one or multiple symbol periods. In some cases, the TTI duration (that is, the number of symbol periods in a TTI) may be variable.

Wireless communications systems such as an NR system may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

In some wireless communications systems, wireless devices (e.g., base stations 105 and UEs 115) may communicate using error-correcting codes, such as polar codes. To construct a polar-encoded codeword, the base stations 105 and UEs 115 may use one or more encoding schemes. For example, a base station 105 or UE 115 may implement a DE scheme for constructing a polar code, or may implement a fractally enhanced kernel polar code. In some cases, DE polar codes may support better performance than fractally enhanced kernel polar code across a wide range of coding rates and payload sizes, but may be more complex and resource intensive.

To improve the performance of fractally enhanced kernel polar codes without significantly increasing either the complexity or memory overhead, wireless devices may implement adjusted fractally enhanced kernel polar codes. To construct an adjusted fractally enhanced kernel polar code, a base station 105 or UE 115 may determine a number of information bits to encode, as well as a block size to transmit. An encoder of the base station 105 or UE 115 may adjust the number of information bits by selecting an additional number of bits and aggregating the information bits for encoding with the additional bits. Furthermore, the encoder may determine a codeword length that supports polar-encoding based on the block size. For example, the encoder may include a number of bits that may be punctured after encoding (e.g., so that the codeblock size is a power of 2 for polar-encoding).

The encoder may recursively split the codeword into sub-blocks, and may allocate the aggregate information bits to the different sub-blocks based on mutual information metrics. When the sub-blocks are less than or equal to a pre-determined threshold size, the encoder may halt the recursive process. The encoder may remove a number of allocated information bits equal to the selected additional number of information bits from one or more of the sub-blocks so that just the information bits for transmission are allocated within the sub-blocks. In some cases, the encoder may remove the information bits from the first half of the sub-blocks, and may refrain from removing a last information bit from any sub-block. Once the additional information bits are removed, the encoder may assign the remaining information bits to bit channels within each sub-block based on a reliability bit channel sequence stored in the memory of the encoder. The base station 105 or UE 115 may then perform block puncturing to reduce the codeword to the specified block size, and may transmit the codeword. A receiving device may receive the codeword, and may decode the transmitted information bits based on a similar adapted fractally enhanced kernel polar coding process.

Figure 2:
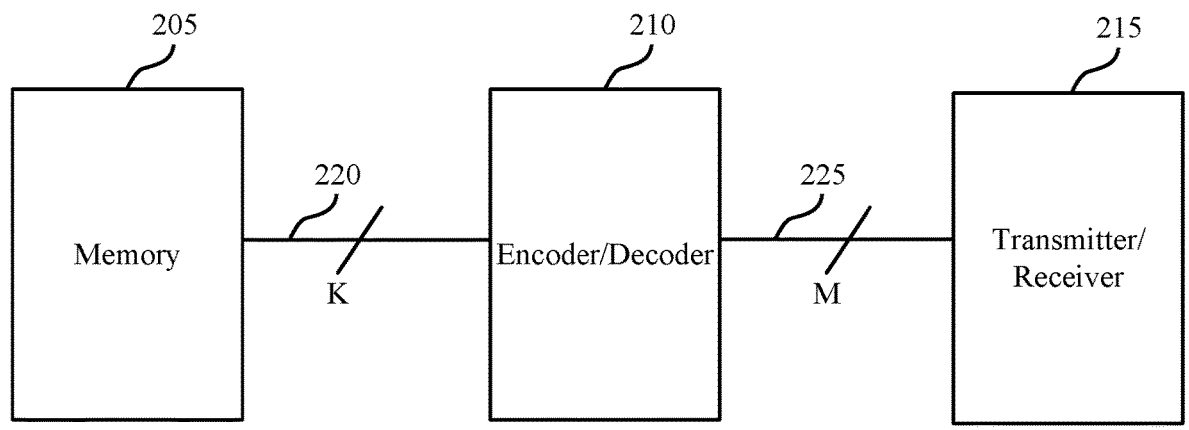
FIG. 2 illustrates an example of a device that supports adjusted fractally enhanced kernel polar codes for achievable SNR spike mitigation in accordance with aspects of the present disclosure.

FIG. 2 illustrates an example of a device 200 that supports adjusted fractally enhanced kernel polar codes for achievable SNR spike mitigation in accordance with various aspects of the present disclosure. The device 200 may be any device within a wireless communications system 100 that performs an encoding or decoding process (e.g., using an error-correcting code, such as a polar code). Device 200 may be an example of a UE 115 or a base station 105 as described with reference to FIG. 1.

As shown, device 200 includes a memory 205, an encoder/decoder 210, and a transmitter/receiver 215. First bus 220 may connect memory 205 to encoder/decoder 210 and second bus 225 may connect encoder/decoder 210 to transmitter/receiver 215. In some cases, device 200 may have data stored in memory 205 to be transmitted to another device, such as a UE 115 or base station 105. To initiate the transmission process, device 200 may retrieve from memory 205 the data for transmission. The data may include a number of payload bits, 'A,' which may be 1s or 0s, provided from memory 205 to encoder/decoder 210 via first bus 220. In some cases, these payload bits may be combined with a number of parity bits, 'L,' to form a total set of information bits, 'A+L.' The number of information bits may be represented as a value 'K,' as shown. The encoder/decoder 210 may implement a polar code with a block length, 'M,' for encoding the information bits, where M may be different than or the same as K. Such a polar code may be referred to as an (M, K) polar code. The bits that are not allocated as information bits (i.e., M–K bits) may be assigned as frozen bits.

In some cases, to perform a polar coding operation, the encoder 210 may need to generate a codeword of length, 'N,' where N is a power of 2 (i.e., N=$2^m$ where m is an integer value). If M is not a power of 2, the encoder 210 may round the value of M up to the nearest valid N value. For example, if M=400, the encoder 210 may determine a codeword length of N=512 (e.g., the nearest valid value for N greater than or equal to M) in order to support polar coding. In these cases, the encoder 210 may encode a codeword of length N, and then may puncture a number of bits N–M to obtain a codeword of the specified block length M for transmission.

The encoder 210 may attempt to assign the information bits to the K most reliable bit channels, and the frozen bits to the remaining bit channels. In some cases (e.g., for large values of M or N, such as N=1024), the encoder/decoder 210 may implement a fractally enhanced kernel polar code for assigning the information bits K to reliable bit channels. Fractally enhanced kernel polar coding may provide better reliability for generated codewords than some polar coding schemes (e.g., bit reversal shorten polarization-weight (PW)), and may be less complex than other polar coding schemes (e.g., DE). Additionally, implementing a fractally enhanced kernel polar code may allow the encoder 210 to flexibly adapt the coding rate when generating codewords.

The encoder 210 may determine information bit channels based on the fractally enhanced kernel polar code, and may assign frozen bits to the remaining channels. Frozen bits may be bits of a default value (e.g., 0, 1) known to both the encoder and decoder (i.e., the encoder encoding information bits at a transmitter and the decoder decoding the codeword received at a receiver). Further, from the receiving device perspective, device 200 may receive encoded data via receiver 215, and may decode the encoded data using decoder 210 to obtain the transmitted data.

In some wireless systems, decoder 210 may be an example of a successive cancellation (SC) or a successive cancellation list (SCL) decoder. A UE 115 or base station 105 may receive a transmission including a codeword at receiver 215, and may send the transmission to the SCL decoder (e.g., decoder 210). The SCL decoder may determine input logarithmic-likelihood ratios (LLRs) for the bit channels of the received codeword. During decoding, the SCL decoder may determine decoded LLRs based on these input LLRs, where the decoded LLRs correspond to each bit channel of the polar code. These decoded LLRs may be referred to as bit metrics. In some cases, if the LLR is zero or a positive value, the SCL decoder may determine the corresponding bit is a 0 bit, and a negative LLR may correspond to a 1 bit. The SCL decoder may use the bit metrics to determine the decoded bit values.

The SCL decoder may employ multiple concurrent SC decoding processes. Each SC decoding process may decode the codeword sequentially (e.g., in order of the bit channel indices). Due to the combination of multiple SC decoding processes, the SCL decoder may calculate multiple decoding path candidates. For example, an SCL decoder of list size 'L' (i.e., the SCL decoder has L SC decoding processes) may calculate L decoding path candidates, and a corresponding reliability metric (e.g., a path metric) for each decoding path candidate. The path metric may represent a reliability of a decoding path candidate or a probability that the corresponding decoding path candidate is the correct set of decoded bits. The path metric may be based on the determined bit metrics and the bit values selected at each bit channel. The SCL decoder may have a number of levels equal to the number of bit channels in the received codeword. At each level, each decoding path candidate may select either a 0 bit or a 1 bit based on a path metric of the 0 bit and the 1 bit. The SCL decoder may select a decoding path candidate based on the path metrics, and may output the bits corresponding to the selected decoding path as the decoded sets of bits. For example, the SCL decoder may select the decoding paths with the highest path metrics.

If an SCL decoder determines that the first number of bits are all frozen bits, the SCL decoder may determine that the correct decoding path for the first number of bits must be the default frozen bit values (e.g., if the default frozen bit value is 0, the correct decoding path for the first number of bits must be all 0's). Once the SCL decoder reaches the first information bit, the SCL decoder may begin performing operations to decode the rest of the bits of the codeword, as the SCL decoder may not be able to determine the correct decoding path from the first information bit onwards (e.g., because the first information bit may be a 0 or a 1). However, the SCL decoder may still determine bit metrics for the bit channels containing frozen bits, and may use these bit metrics when calculating path metrics for the decoding path candidates. For example, the SCL decoder may update the path metric for the decoding candidates after every bit, regardless of bit type (e.g., after each frozen bit, payload bit, parity bit).

In some cases, an encoder 210 and decoder 210 may implement adjusted fractally enhanced kernel polar codes. The encoder 210 may adjust the construction of the polar code using an additional number of information bits that may be removed following a recursive information bit allocation process. The adjusted fractally enhanced kernel polar coding process may mitigate or remove spikes in the achievable SNR for a codeword transmission by shifting information bits from channels of lower capacity to channels of higher capacity. The adjusted fractally enhanced kernel polar codes may have a similar complexity and memory overhead as fractally enhanced kernel polar codes. Additionally, the adjusted fractally enhanced kernel polar codes may have similar—or better for some numbers of information bits K—achievable SNR curves than DE polar codes, with lower complexity and overhead.

Figure 3:
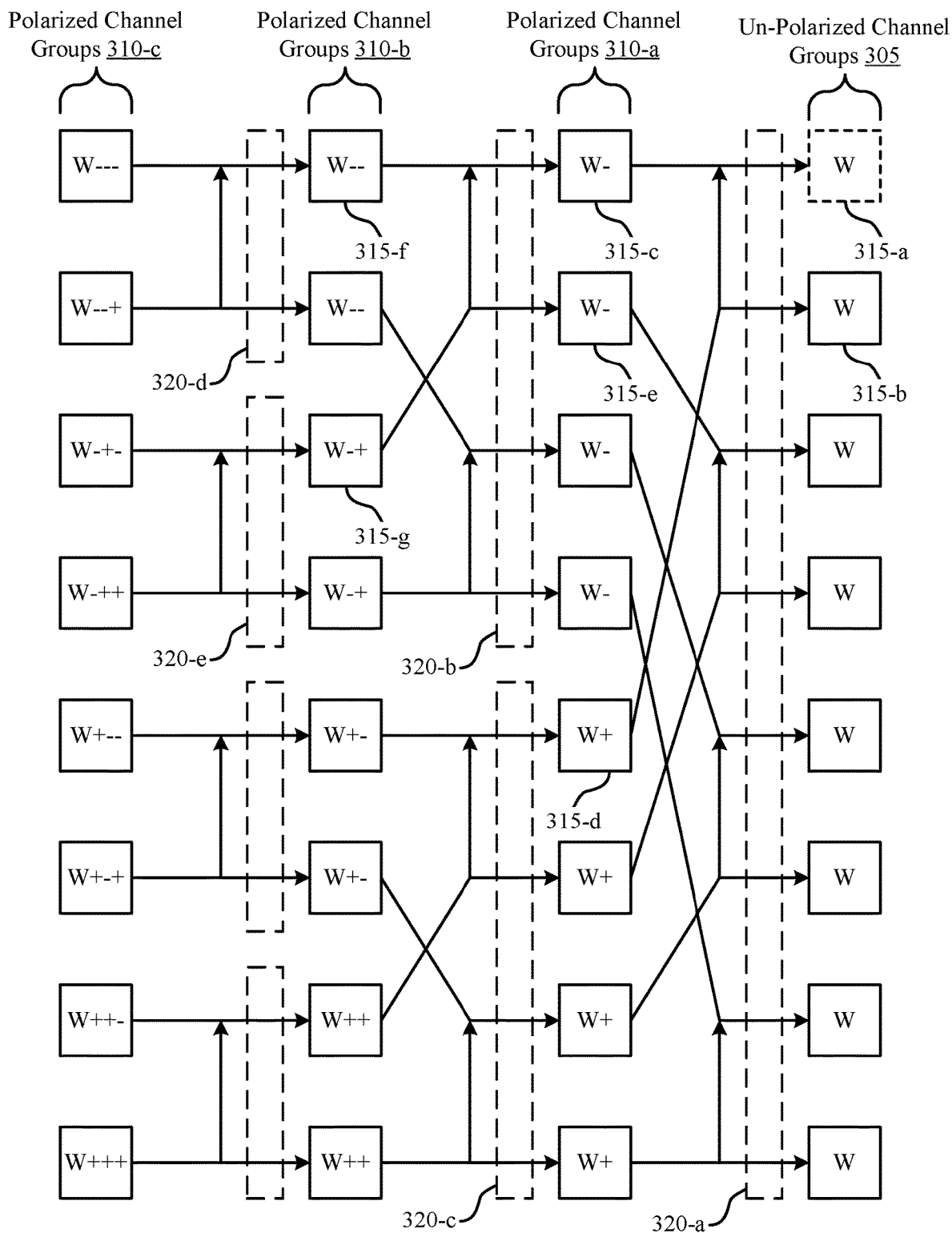
FIG. 3 illustrates an example of a fractally enhanced kernel polar code construction that supports adjusted fractally enhanced kernel polar codes for achievable SNR spike mitigation in accordance with aspects of the present disclosure.

FIG. 3 illustrates an example of a fractally enhanced kernel polar code construction 300 that supports adjusted fractally enhanced kernel polar codes for achievable SNR spike mitigation in accordance with various aspects of the present disclosure. The fractally enhanced kernel polar code construction 300 may be performed by an encoder/decoder 210, which may be a component of a base station 105 or UE 115 as described herein with reference to FIGS. 1 and 2. The fractally enhanced kernel polar code construction 300 may show a visual representation of polarization and information bit channel assignments for a polar-encoded codeword. An encoder may receive an un-polarized channel group 305 as input, and may perform a series of recursive polarizations to obtain polarized channel group 310-c.

To determine the distribution of information bits between bit channels or channel groups, an encoder may utilize mutual information. Mutual information may be an example of a metric for DE, and may map rate distributions R for un-polarized channels 315 W to rate distributions R1 and R2 for polarized channels 315 W+ and W−, respectively. In some cases, an encoder may utilize mutual information (e.g., as opposed to reliability metrics) to assign bit channels based on coding rate, R. To construct a capacity achieving polar code with SC decoding for a channel 315 W with a coding rate R=K/N, the encoder may distribute the information bits K such that polarized channels 315 W− and W+ also achieve capacity. To achieve capacity on channels 315 W− and W+, the encoder may distribute information bits according to:

$$K_{upper} = R0 * \left(\frac{N}{2}\right), K_{lower} = R1 * \left(\frac{N}{2}\right), \text{ and } K_{upper} = \frac{R0}{R0 + R1} * K,$$

where $K_{upper}$ is the number of information bits to include in the first half of sub-blocks, $K_{lower}$ is the number of information bits to include in the second half of sub-blocks, R0 is the capacity of channel W−, and R1 is the capacity of channel W+. In some cases, $K_{upper}$ may be referred to as K− and $K_{lower}$ may be referred to as K+.

For the fractally enhanced kernel polar code construction 300 with greater than two channels, the encoder may recursively perform these polarizations and information bit assignment procedures. For example, as illustrated, the encoder may polarize un-polarized channels 315-a and 315-b, resulting in polarized channels 315-c and 315-d. In this case, based on the channel polarization, channel 315-d may have a greater channel capacity than channel 315-c. Accordingly, channel 315-d may be referred to as channel W+(e.g., greater channel capacity than an un-polarized channel 315 W), and channel 315-c may be referred to as W− (e.g., lesser channel capacity than the un-polarized channel 315 W). Similarly, the encoder may polarize the other un-polarized channels 315 in the un-polarized channel group 305, resulting in polarized channel group 310-a. As each polarization process receives two channels 315 (e.g., with equal channel capacity) as input, and outputs two polarized channels (e.g., one channel with higher channel capacity than the inputs, and one channel with lower channel capacity), each stage of the recursive process may turn a group of channels into two equally sized sub-blocks 320 of polarized channels.

As illustrated, an encoder may polarize a set of eight input channels 315. These eight input channels 315 may correspond to the codeword size N for encoding. The encoder may encode a number of information bits K (e.g., four information bits) within this codeword. Accordingly, before the first recursive step, the encoder may include one block 320-a corresponding to N total bits and K information bits. Upon performing the first recursive step, the encoder may generate polarized channel group 310-a, where a first half of the channels 315 have a lower capacity and a second half of the channels 315 have a higher capacity. The first half of the channels 315 may correspond to a first sub-block 320-b, and the second half may correspond to sub-block 320-c. In the case described herein where N=8, each of these sub-blocks 320 may include four total bits.

The encoder may use the mutual information metrics to determine how many information bits to include in each sub-block 320. For example, the encoder may include a channel polarization mutual information transfer chart—or a table with functions or values representing the channel polarization mutual information transfer chart—in memory. The encoder may determine target mutual information for the input channel 315 W based on the target coding rate R. For example, as described herein, a codeword of length N=8 containing a number of information bits K=4 may result in a target code rate of R=K/N=½. Based on the target mutual information for the input channel 315 W and the channel polarization mutual information transfer chart, the encoder may determine the target mutual information for the output channels 315 W− and W+, where the target mutual information values may be referred to as Cap(W−) and Cap(W+), respectively. The encoder may then determine the information bits K0 to include in the first sub-block 320-b and the information bits K1 to include in the second sub-block 320-c according to the equations:

$$K0+K1=K \text{ and } K0/K1=Cap(W-)/Cap(W+),$$

such that the encoder allocates a number of information bits K0 to channels W− and a number of information bits K1 to channels W+ proportional to the capacity or mutual information of the channels W− and W+. For example, in the case described herein, the encoder may allocate one information bit (i.e., K0=1) to the first sub-block 320-b and three information bits (i.e., K1=3) to the second sub-block 320-c. In some cases, the encoder may perform rounding to assign an integer number of information bits to each sub-block 320.

In a next step, the encoder may recursively perform the polarization process on each sub-block 320. For example, the encoder may polarize the channels 315 in sub-block 320-b to generate sub-blocks 320-d and 320-e. In this case, the input channels 315-c and 315-e may have channel capacities of W−(e.g., based on the polarization in the first step of the recursive process), and the corresponding output channels 315-f and 315-g may have resulting channel capacities of W−− (e.g., a lower channel capacity than W−) and W−+ (e.g., a greater channel capacity than W−). In this way, polarized channel group 310-b may include channels 315 with greater polarization diversity than polarized channel group 310-a. Similar to the process described herein, the encoder may implement the channel polarization mutual information transfer chart to determine the information bits to assign to sub-blocks 320-d and 320-e. For example, following this next step in the recursive polarization process, sub-block 320-d may have size N=2 and information bits K00=0, and sub-block 320-e may have size N=2 and information bits K01=1.

The encoder may continue this recursive process of polarization and information bit allocation until the sub-blocks 320 for a polarized channel group 310 are less than or equal to a pre-determined threshold sub-block size (e.g., 32, 64, 128) with a pre-calculated bit channel reliability sequence. For example, the encoder may store a known bit sequence in memory (e.g., based on or derived by a PW, Gaussian approximation (GA) DE, mutual information DE, nested DE, or some similar technique) for one or more codeword sizes. In some cases, the encoder may store a bit sequence for a codeword of length 64 bits. In such cases, the encoder may terminate the fractally enhanced kernel polar code construction 300 when the sub-blocks 320 for a polarized channel group 310 have a codeword length of 64 bits, and may allocate information bits within these 64 bit sub-blocks 320 based on the bit sequence stored in memory. In some cases, the encoder may store additional bit sequences for code blocks of sizes less than the threshold size (e.g., in case the input codeword contains fewer total bits than the threshold sub-block size, the encoder may allocate information bits without performing any recursive steps).

The above process may result in reliable polar-encoded codewords for input channels 315 with even channel capacities (e.g., all of the input channels start with capacities W). However, in some cases, an encoder may perform bit puncturing. For example, the encoder may receive a polar code with block length M for encoding. However, for the polar coding procedure, the encoder may need a number of channels N, where $N=2^m$ for integer values of m. In such cases, the encoder may puncture a number of bits N−M in order to use the specified block length for polar coding. For example, the encoder may receive a block length M=7 for polar encoding. To perform the polar encoding procedure, the encoder may round the block length up to the nearest power of 2 (e.g., to satisfy the criteria for polar encoding where $N=2^m$ for integer values of m). In this case, the encoder may determine N=8 for M=7, with one bit to puncture. The encoder may perform unknown-bit puncturing (e.g., block puncturing) or known-bit puncturing (e.g., shortening). In the case of unknown-bit puncturing, the encoder may puncture the first bit of the codeword, corresponding to channel 315-a. In this case, the encoder may process the channel 315-a (e.g., and any other channels 315 corresponding to punctured bits) as if the channel has a capacity and mutual information of 0. Additionally, in some cases, the encoder may determine capacities for the un-punctured channels 315 based on the number of information bits, the total number of bits, and the number of punctured bits. The encoder may use these uneven channel capacities, along with the channel polarization mutual information transfer chart in memory, to determine the information bit allocations for each sub-block 320.

In some cases (e.g., when implementing block puncturing), the uneven input channel capacities may result in generating inefficient or unreliable codewords. For example, in block puncturing, the bit puncturing is front-loaded within a codeword. As block punctured bits correspond to channel capacities of 0 during the fractally enhanced kernel polar code construction 300, block puncturing may result in non-uniform polarization speeds for different sub-blocks 320 or bit channels 315. These channel capacities of 0 may result in less polarization, and accordingly smaller values of K−/K+. The fractally enhanced kernel polar code construction 300, according to the properties of the channel polarization mutual information transfer chart, may allocate more information bits K− in the first half sub-block 320 than other polar coding schemes (e.g., DE schemes) when the value of K−/K+ is relatively small. As the bit channels 315 available in the first half of the codeword may have lower channel capacities than the bit channels in the second half of the codeword, this allocation of information bits may result in less reliable codewords (e.g., a number of the information bit channels 315 allocated in the first half of the codeword may have lower channel capacities than a number of frozen bit channels 315 in the second half of the codeword). To better allocate information bits to more reliable bit channels 315, the encoder may implement an adjusted information bit assignment process.

Figure 4:
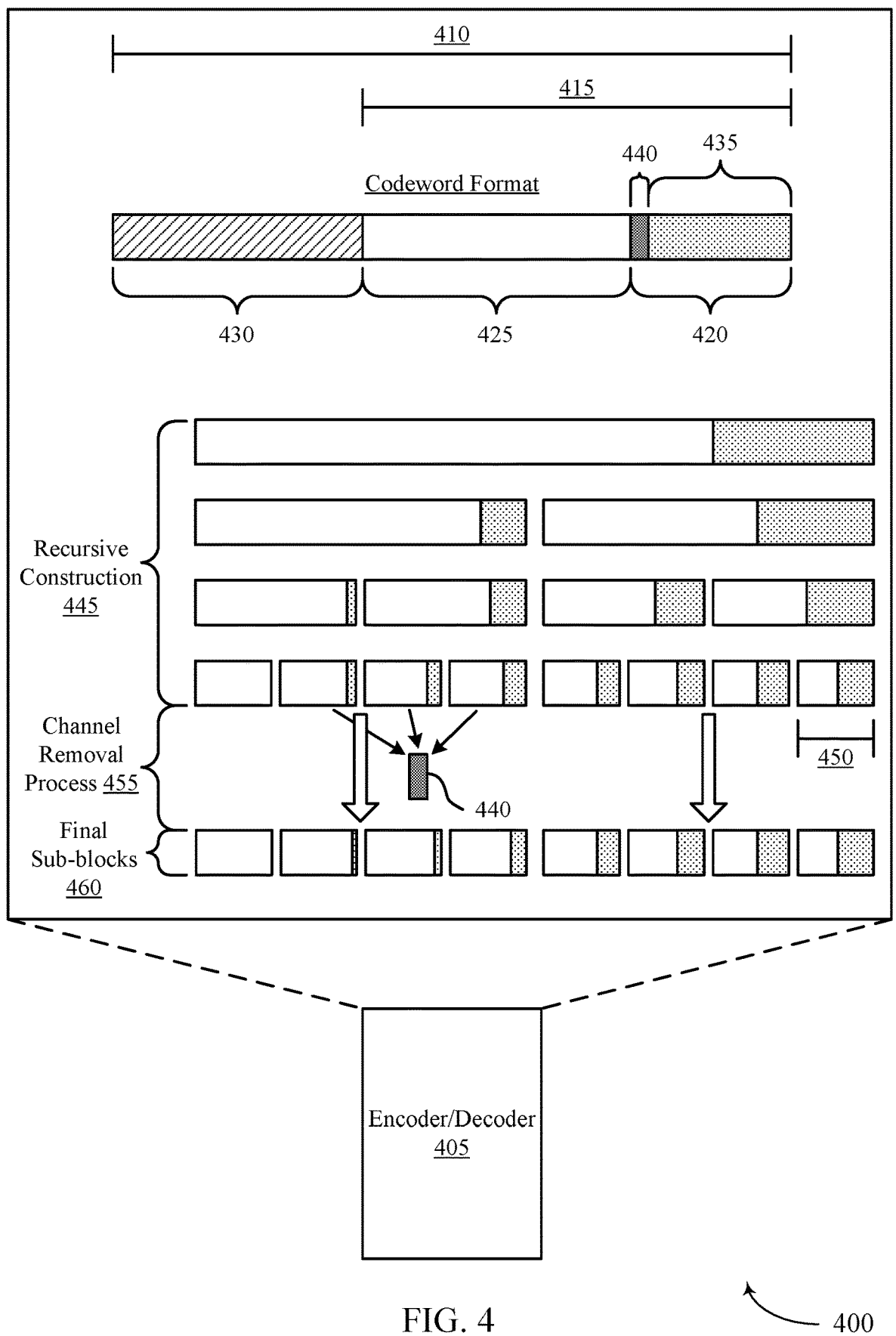
FIG. 4 illustrates an example of an adjusted information bit assignment process that supports adjusted fractally enhanced kernel polar codes for achievable SNR spike mitigation in accordance with aspects of the present disclosure.

FIG. 4 illustrates an example of an adjusted information bit assignment process 400 that supports adjusted fractally enhanced kernel polar codes for achievable SNR spike mitigation in accordance with various aspects of the present disclosure. The adjusted information bit assignment process 400 may be performed by an encoder 405, which may be an example of an encoder 210 as described with reference to FIG. 2. The encoder may implement a modification of the fractally enhanced kernel polar code construction 300 scheme described herein with reference to FIG. 3. The encoder 405 may encode K information bits 435 into a polar code of M block length 415 using the adjusted information bit assignment process 400 to improve the reliability of the resulting codeword and mitigate any spikes in the achievable SNR values.

In some encoding cases, the block length 415 may not be a power of 2. In these cases, to enable polar coding, the encoder 405 may round the block length 415 up to the nearest power of 2 to support polar code construction. For example, the encoder 405 may round the value M of the block length 415 up to the value N for the length of the codeword 410 for construction. The additional bits (e.g., the bits added to the specified block length 415 to obtain the codeword length 410) may be punctured bits 430 that the encoder 405 may remove later following polar code construction. Rather than construct an (M, K) polar code based on the information bits 435 and block length 415, the encoder 405 may determine a number of additional information bits 440 to include in the polar code construction. The encoder 405 may aggregate these 'ΔK' additional information bits 440 with the K actual information bits 435 to determine a number of information bits 420 for the adjusted fractally enhanced kernel polar code construction. Based on this adjusted value, the encoder 405 may perform polar code construction based on a codeword of length N, with information bits 420, frozen bits 425, and punctured bits 430.

The encoder 405 may perform a recursive fractally enhanced kernel polar code construction 445. For example, to perform the recursive fractally enhanced kernel polar code construction 445, the encoder 405 may assign input mutual information values of (K+ΔK)/M for each un-punctured bit (e.g., information bits 420 and frozen bits 425) and values of 0 for each punctured bit (e.g., punctured bits 430). Based on these input mutual information values, and based on channel polarization mutual information transfer data stored in memory of the encoder 405, the encoder 405 may perform the recursive fractally enhanced kernel polar code construction 445 until obtaining a set of sub-blocks of a pre-determined threshold size 450, at which point the encoder 405 may terminate the recursive process.

After terminating the recursive process, the encoder 405 may perform an information bit channel removal process 455. The set of sub-blocks obtained from the recursive fractally enhanced kernel polar code construction 445 contains a number of allocated information bits 420 (e.g., K+ΔK), which is greater than the actual number of information bits 435 (e.g., K) to encode. To handle the ΔK additional information bits 440 used in the polar code construction, the encoder 405 may remove ΔK assigned information bits following the recursive process.

The encoder 405 may select information bits for removal based on one or more properties of fractally enhanced kernel polar codes. For example, as the sub-blocks after construction follow a pre-calculated bit reliability sequence known to the encoder 405, the encoder may determine which bit channels in each sub-block are the least reliable. Additionally, based on the polarization from the recursive fractally enhanced kernel polar code construction 445, the encoder 405 may determine a reliability order of sub-blocks as well. The encoder 405 may remove the additional information bits 440 based on the determined reliability orders for the corresponding bit channels. By removing less reliable bits (e.g., bits to be assigned to low capacity channels), the encoder 405 may improve the encoding performance, and correspondingly the likelihood that a receiving device will successfully receive and decode the codeword.

In some cases, the encoder 405 may remove the additional information bits 440 and corresponding bit channels based on the order of the sub-blocks. For example, the encoder 405 may determine that a portion of the sub-blocks may contain worse (e.g., lower reliability or lower channel capacity) bit channels than another portion of the sub-blocks. In some cases due to the polarization technique implemented by the encoder 405, the first half of the sub-blocks may include bit channels with lower reliability than the second half of the sub-blocks. Accordingly, the encoder 405 may determine to remove the additional information bits 440 from the first half of the sub-blocks.

The encoder 405 may include an algorithm for determining the additional information bits 440 to remove. The encoder 405 may determine a portion of the sub-blocks to remove information bits from, where the portion may include 't' sub-blocks. In some cases, the encoder 405 may arrange the information bits assigned to each sub-block in order of increasing reliability (e.g., where the bits increase in reliability from a first information bit to a last information bit). In order to spread the bits for removal across the sub-blocks, the encoder 405 may remove the first ΔK/t bits (e.g., including rounding) from each sub-block of the identified portion. In some cases, the encoder 405 may refrain from removing the last information bit from any sub-block (e.g., to improve performance). In some cases, the encoder 405 may not be able to remove ΔK information bits 440 from the first portion (e.g., half) of sub-blocks based on the removal algorithm. For example, the encoder 405 may remove information bits until each sub-block of the first portion of sub-blocks includes either 0 information bit or 1 information bit. In these cases, if the encoder 405 still has bits to remove, the encoder 405 may remove the remaining bits of the ΔK additional information bits 440 from another portion of the sub-blocks (e.g., the second half of sub-blocks). In this case, the encoder 405 may remove a first bit from each sub-block of the second portion, then a second bit from each sub-block, etc., until the encoder 405 has removed the full ΔK additional information bits 440.

After the information bit channel removal process 455, the encoder 405 may obtain a final set of sub-blocks 460 with allocated information bits 435. The encoder 405 may assign information bit channels based on the number of information bits allocated to each sub-block and the pre-calculated bit reliability sequence for sub-blocks of the pre-determined threshold size 450. The encoder 405 may then aggregate the final set of sub-blocks 460 to generate the codeword, with codeword length 410. In order to transmit a codeword of the specified block length 415, the encoder 405 may perform block puncturing on punctured bits 430. In this way, the encoder 405 may construct an (M, K) polar code. Using the adjusted information bit assignment process 400, the encoder 405 may shift information bits into bit channels with greater capacities to improve the reliability of the codeword.

In one specific example, the encoder 405 may construct a (2160, 1430) polar code. As M=2160, the encoder 405 may round the codeword size to N=4096 for polar encoding, which may result in 1936 bits to puncture. The encoder 405 may adjust the fractally enhanced kernel polar coding procedure to include an additional 8 information bits ΔK. If the encoder 405 utilizes a pre-determined threshold size 450 of 64, the encoder 405 may perform six recursive steps to obtain sixty-four sub-blocks of length 64. In this case, the encoder 405 may allocate two sub-blocks of the first half of sub-blocks with information bits (e.g., of the first thirty-two sub-blocks, one may contain 11 allocated information bits and one may contain 41 allocated information bits). Based on a bit removal algorithm, the encoder 405 may determine which 8 information bits to remove before assigning the information bits to information bit channels.

Based on the recursive bit allocation process, 6 out of 8 "worst" information bits (e.g., information bits that would be assigned to channels with the lowest channel capacities) may be located in the first half of sub-blocks. In some cases, the encoder 405 may remove ΔK/t=4 information bits from each of the sub-blocks containing information bits within the first half of sub-blocks. In these cases, the encoder 405 may remove all of the worst information bits from this first half of the sub-blocks. The remaining 2 worst information bits may have large bit indices (e.g., as they are contained in the second half of the sub-blocks, which necessarily have larger bit indices than the first half). A decoder 405 (e.g., an SC or SCL decoder) may have a higher probability of decoding these bits with larger bit indices correctly, due to the sequential nature of SC or SCL decoding and the removal of the worst bits with smaller bit indices from the information set. The encoder 405 may assign the remaining information bits 435 (e.g., after this information bit channel removal process 455) to information bit channels based on the allocated sub-blocks and the bit sequence stored in memory for sub-blocks of size 64.

In a second specific example, the encoder 405 may construct a (2240, 1110) polar code using a ΔK of 8 and a pre-determined threshold sub-block size of 512. In this example, the encoder 405 may perform recursive steps to obtain sixty-four sub-blocks of size 64, where three sub-blocks of the first half (i.e., 32 sub-blocks) contain allocated information bits. In some cases, these three sub-blocks may contain 5, 8, and 39 allocated information bits, respectively. The encoder 404 may remove 3, 2, and 2 information bits from these three sub-blocks respectively according to the bit-removal algorithm. In such a bit allocation, 7 of the 8 "worst" information bits may be located in the first half of the sub-blocks. The encoder 405 may remove 6 of the 7 worst information bits from the first half of sub-blocks. In some cases, even if the encoder 405 allocated one information bit to a fourth sub-block in the first half of sub-blocks, the encoder 405 may refrain from removing the information bit from this fourth sub-block, as that information bit corresponds to the last information bit for that sub-block. The bit removal algorithm may significantly reduce the error propagation in decoding, improving a main source of weakness in SC or SCL decoding. In both of these examples, and for many different numbers of information bits, coding rates, and codeblock sizes, implementing the adjusted information bit assignment process 400 may improve the performance of fractally enhanced kernel polar codes with a minimal complexity increase.

In some cases, the encoder 405 may determine the number of additional information bits 440 based on a function. The encoder 405 may calculate ΔK based on a fraction of punctured bits, for example, using some function $f$:

$$\Delta K = f\left(\frac{N - M}{N}\right),$$

where $f(x)$ is a decreasing function of x.

Figure 5:
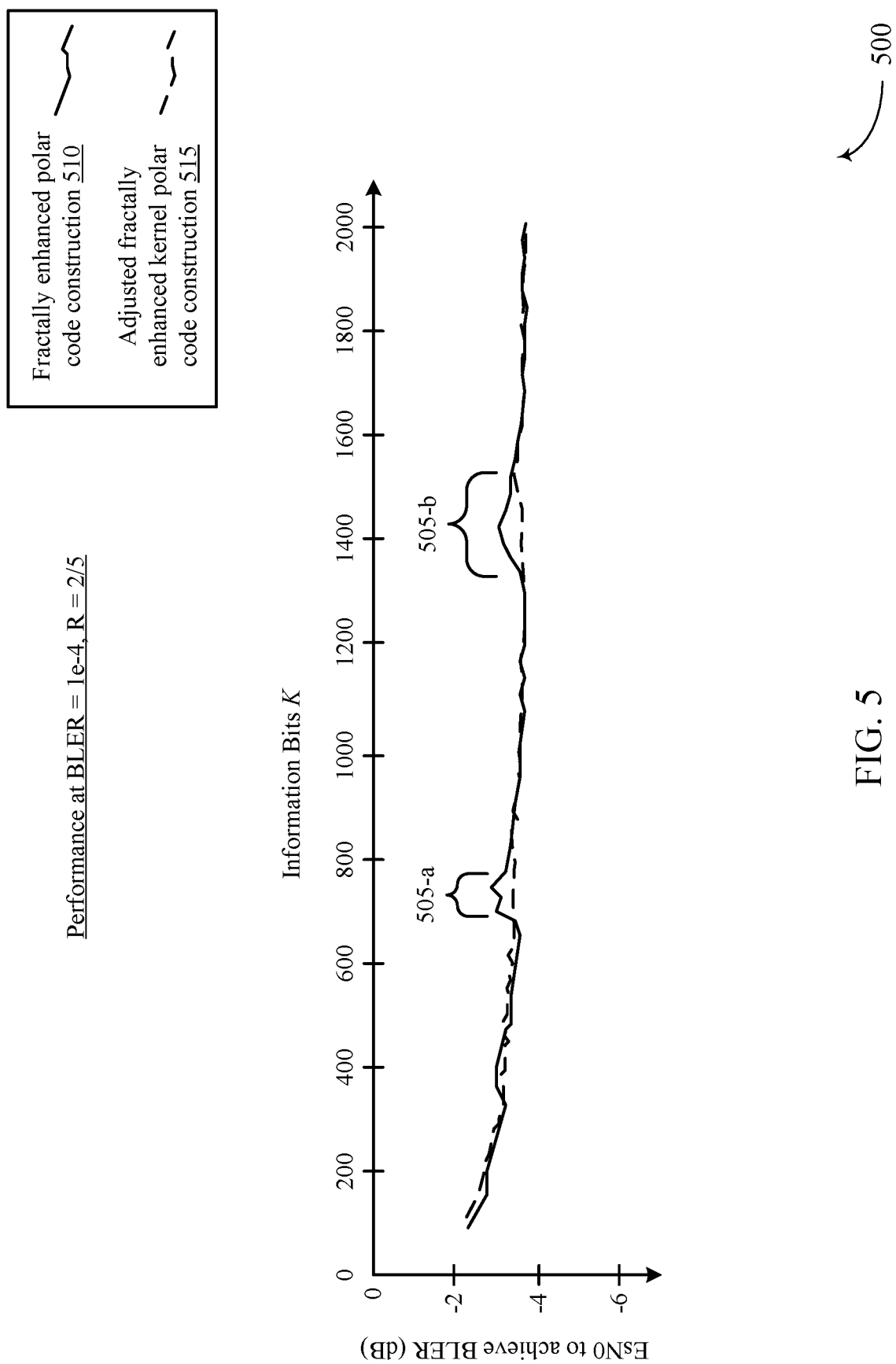
FIG. 5 illustrates exemplary simulation results for adjusted fractally enhanced kernel polar codes for achievable SNR spike mitigation in accordance with aspects of the present disclosure.

FIG. 5 illustrates exemplary simulation results 500 for adjusted fractally enhanced kernel polar codes for achievable SNR spike mitigation in accordance with various aspects of the present disclosure. As illustrated, the exemplary simulation results 500 show simulated symbol-energy-to-noise ratio (EsN0) values calculated to achieve a block error ratio (BLER) of 1e–4 at a coding rate R of 2/5. The results of the simulation indicate expected spikes 505-a and 505-b in the EsN0 values—and corresponding spikes in achievable SNR—for fractally enhanced kernel polar codes 510 at certain numbers of information bits K. For example, for a coding rate R=2/5, the exemplary simulation results 500 illustrate an expected spike 505-a when encoding approximately 700-800 information bits, and another expected spike 505-b when encoding approximately 1330-1500 information bits using fractally enhanced kernel polar codes 510. However, as illustrated, the simulation results indicate no such spikes for adjusted fractally enhanced kernel polar codes 515. That is, if an encoder implements an adjusted information bit assignment process 400 as described herein with reference to FIG. 4, the encoder may mitigate the achievable SNR spikes. Similar simulations performed at other coding rates (e.g., R=1/12, R=1/8, R=1/6, R=1/5, R=1/3, R=1/2, and R=2/3) illustrated similar mitigations of the achievable SNR spikes. Accordingly, the adjusted fractally enhanced kernel polar codes 515 may enable an encoder to generate reliable codewords over a wider range of information bit values K than fractally enhanced kernel polar codes 510 (e.g., for a wide range of coding rates R).

Figure 6:
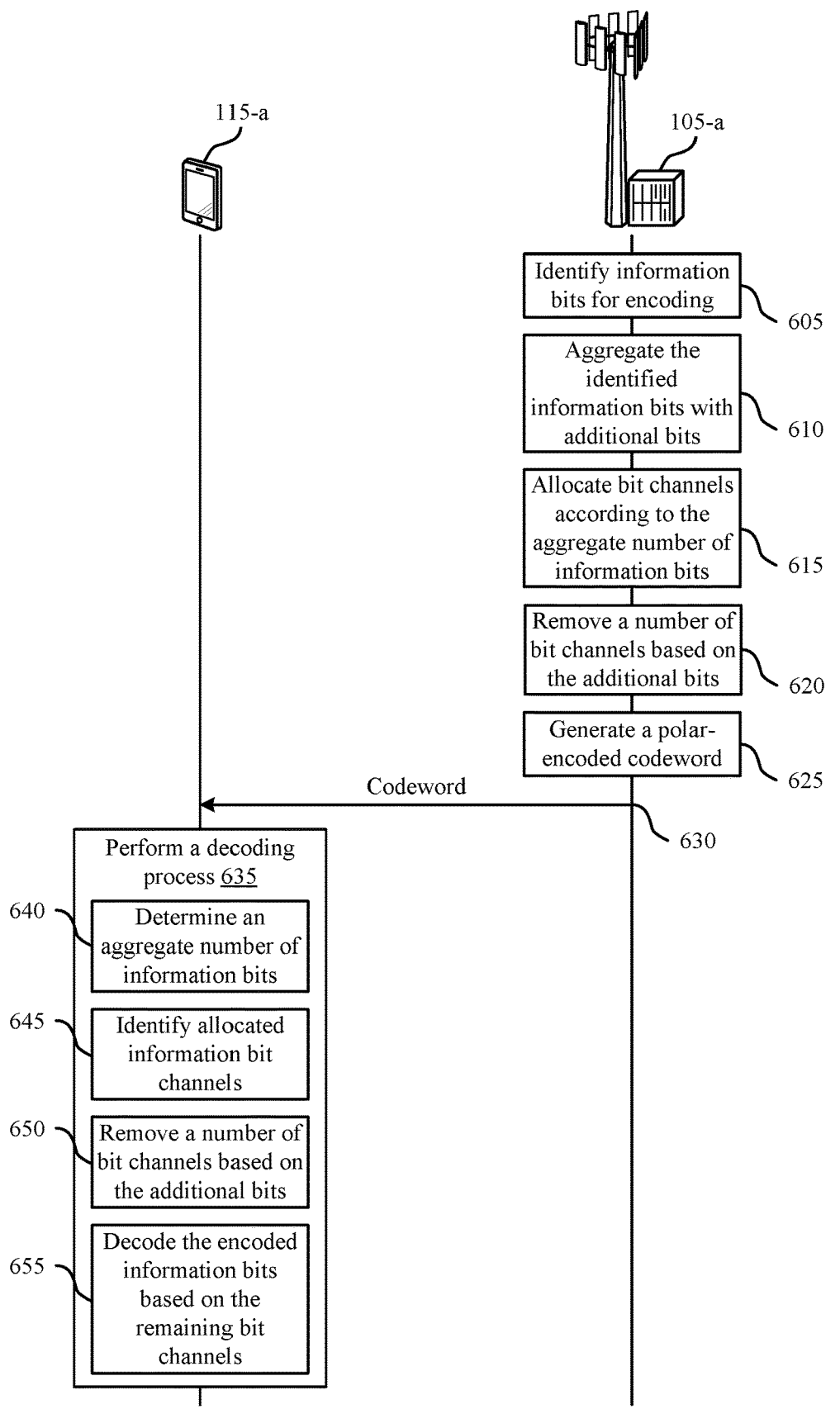
FIG. 6 illustrates an example of a process flow that supports adjusted fractally enhanced kernel polar codes for achievable SNR spike mitigation in accordance with aspects of the present disclosure.

FIG. 6 illustrates an example of a process flow 600 that supports adjusted fractally enhanced kernel polar codes for achievable SNR spike mitigation in accordance with various aspects of the present disclosure. The process flow 600 may include an encoding device implementing an encoder and a decoding device implementing a decoder as described herein, for example, with reference to FIGS. 1-4. As illustrated, the encoding device may be an example of a base station 105 and the decoding device may be an example of a UE 115, as described with reference to FIG. 1. However, it is to be understood that any wireless device may perform the encoding or decoding processes. For example, UE 115-*a* may alternatively perform the encoding processes, and base station 105-*a* may perform the decoding processes.

At 605, an encoder (e.g., as a component of an encoding device, such as base station 105-*a*) may identify a set of information bits for encoding. For example, base station 105-*a* may identify K information bits from memory.

At 610, base station 105-*a* may determine an aggregate number of information bits for fractally enhanced kernel polar code construction. For example, base station 105-*a* may aggregate the identified K information bits with an additional ΔK information bits.

At 615, base station 105-*a* may allocate a total number of information bit channels according to the fractally enhanced kernel polar code construction and the aggregated K+ΔK information bits. For example, base station 105-*a* may allocate the information bit channels based on recursively splitting a length of the polar-encoded codeword into a set of sub-blocks, assigning information bits of the aggregated information bits to the sub-blocks based on mutual information metrics and a channel polarization mutual information transfer chart, and allocating the total number of information bit channels (e.g., K+ΔK information bit channels) based on the number of information bits assigned to each sub-block.

At 620, base station 105-*a* may remove a number of allocated information bit channels to obtain a final set of allocated information bit channels, where the number of removed information bit channels is equal to the number of aggregated additional bits (i.e., ΔK). In some cases, base station 105-*a* may remove the information bit channels from a first portion of sub-blocks (e.g., the first half of the sub-blocks), and may not remove any information bits channels from a second portion (e.g., second half) of the sub-blocks.

At 625, base station 105-*a* may generate a polar-encoded codeword based on assigning the K information bits to the final set of allocated information bit channels. Base station 105-*a* may perform block puncturing to reduce the codeword to a specified block length.

At 630, base station 105-*a* may transmit the codeword to a decoding device (e.g., UE 115-*a*). UE 115-*a* may receive the fractally enhanced kernel polar coded codeword. At 635, UE 115-*a* may perform a decoding process on the polar-encoded codeword. The decoding process may involve the processes described herein.

At 640, UE 115-*a* may determine an aggregate number of information bits to decode from the codeword. The aggregate number of information bits, K+ΔK, may correspond to the sum of the information bits K and the additional information bits ΔK used to construct the codeword.

At 645, UE 115-*a* may identify allocated information bit channels according the fractally enhanced kernel polar code construction and the determined aggregate number of information bits. Identifying the allocated information bit channels may involve performing the same recursive splitting into sub-blocks as performed by base station 105-*a*, and determining assignments of information bits to the sub-blocks based on mutual information metrics and the channel polarization mutual information transfer chart. UE 115-*a* may identify the allocated information bit channels based on the determined number of information bits for each of the sub-blocks.

At 650, UE 115-*a* may remove a number of allocated information bit channels from the identified allocated information bit channels to obtain a final set of allocated information bit channels. For example, UE 115-*a* may remove the same number of bit channels as identified additional bits, ΔK. In some cases, UE 115-*a* may remove the bit channels from a first portion (e.g., half) of the sub-blocks, and not from a second portion of the sub-blocks. After removing the bit channels, UE 115-*a* may identify the final set of allocated information bit channels used by base station 105-*a* for information bits. At 655, UE 115-*a* may decode the encoded set of information bits from the codeword based on the obtained final set of allocated bit channels.

Figure 7:
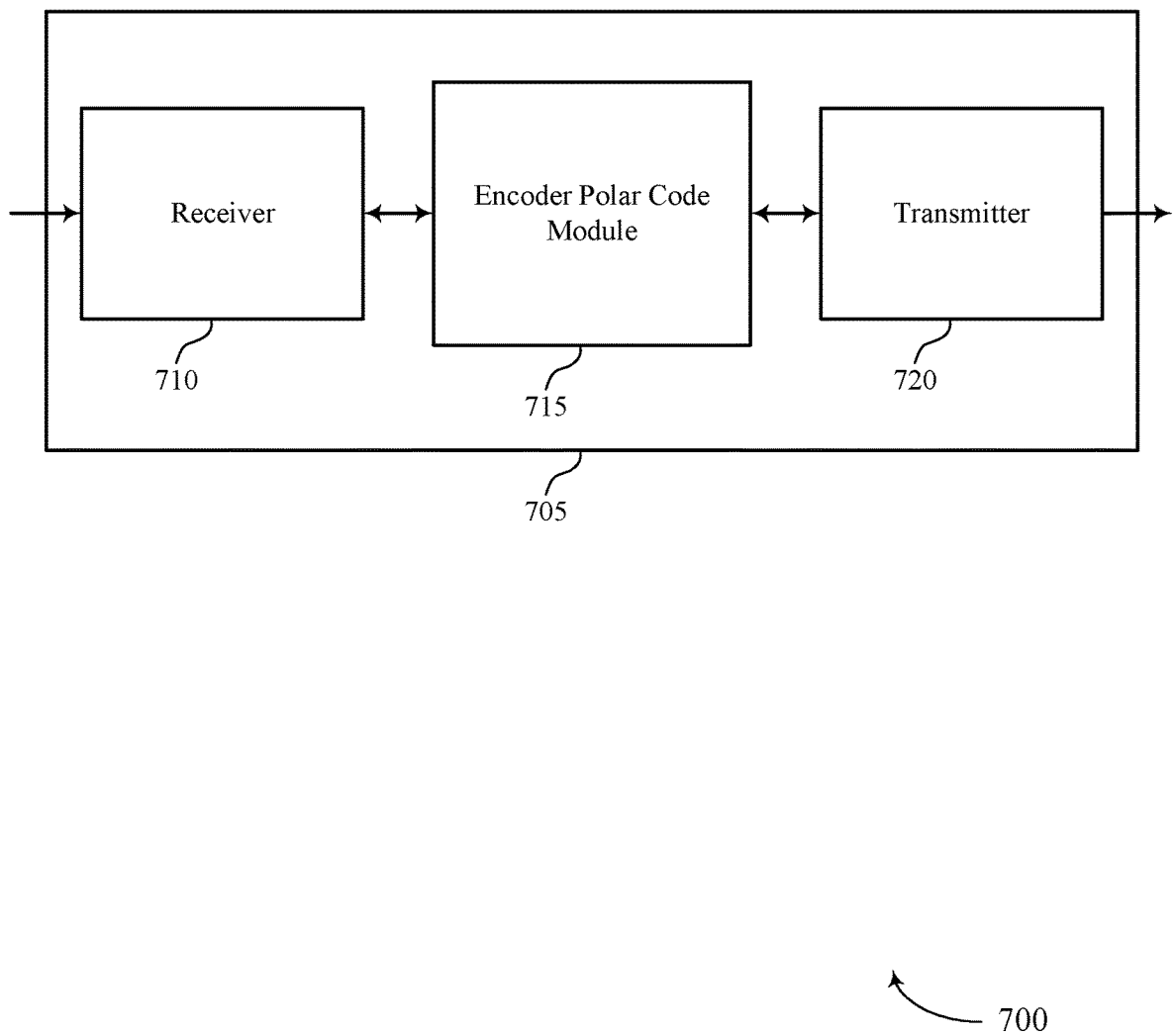
FIGS. 7 through 9 show block diagrams of a device that supports adjusted fractally enhanced kernel polar codes for achievable SNR spike mitigation in accordance with aspects of the present disclosure.

FIG. 7 shows a block diagram 700 of a wireless device 705 that supports adjusted fractally enhanced kernel polar codes for achievable SNR spike mitigation in accordance with aspects of the present disclosure. Wireless device 705 may be an example of aspects of an encoder, which may be a component of a base station 105 or a UE 115, as described herein. Wireless device 705 may include receiver 710, encoder polar code module 715, and transmitter 720. Wireless device 705 may also include a processor. Each of these components may be in communication with one another (e.g., via one or more buses).

Receiver 710 may receive information such as packets, user data, or control information associated with various information channels (e.g., control channels, data channels, and information related to adjusted fractally enhanced kernel polar codes for achievable SNR spike mitigation). Information may be passed on to other components of the device. The receiver 710 may be an example of aspects of the transceiver 1035 described with reference to FIG. 10. The receiver 710 may utilize a single antenna or a set of antennas.

Encoder polar code module 715 may be an example of aspects of the encoder polar code module 1015 described with reference to FIG. 10.

Encoder polar code module 715 and/or at least some of its various sub-components may be implemented in hardware, software executed by a processor, firmware, or any combination thereof. If implemented in software executed by a processor, the functions of the encoder polar code module 715 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The encoder polar code module 715 and/or at least some of its various sub-components may be physically located at various positions, including being distributed such that portions of functions are implemented at different physical locations by one or more physical devices. In some examples, encoder polar code module 715 and/or at least some of its various sub-components may be a separate and distinct component in accordance with various aspects of the present disclosure. In other examples, encoder polar code module 715 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Encoder polar code module 715 may identify a set of information bits including a number of bits for encoding, determine an aggregate number of information bits for fractally enhanced kernel polar code construction, where the aggregate number of information bits is equal to a sum of the number of bits for encoding and an additional number of bits, and allocate a total number of information bit channels according to the fractally enhanced kernel polar code construction and the aggregate number of information bits. Encoder polar code module 715 may remove a number of allocated information bit channels from the total number of information bit channels to obtain a final set of allocated information bit channels, where the number of removed allocated information bit channels is equal to the additional number of bits, generate a polar-encoded codeword based on assigning the set of information bits to the final set of allocated information bit channels, and transmit the polar-encoded codeword.

Transmitter 720 may transmit signals generated by other components of the device. In some examples, the transmitter 720 may be collocated with a receiver 710 in a transceiver module. For example, the transmitter 720 may be an example of aspects of the transceiver 1035 described with reference to FIG. 10. The transmitter 720 may utilize a single antenna or a set of antennas.

Figure 8:
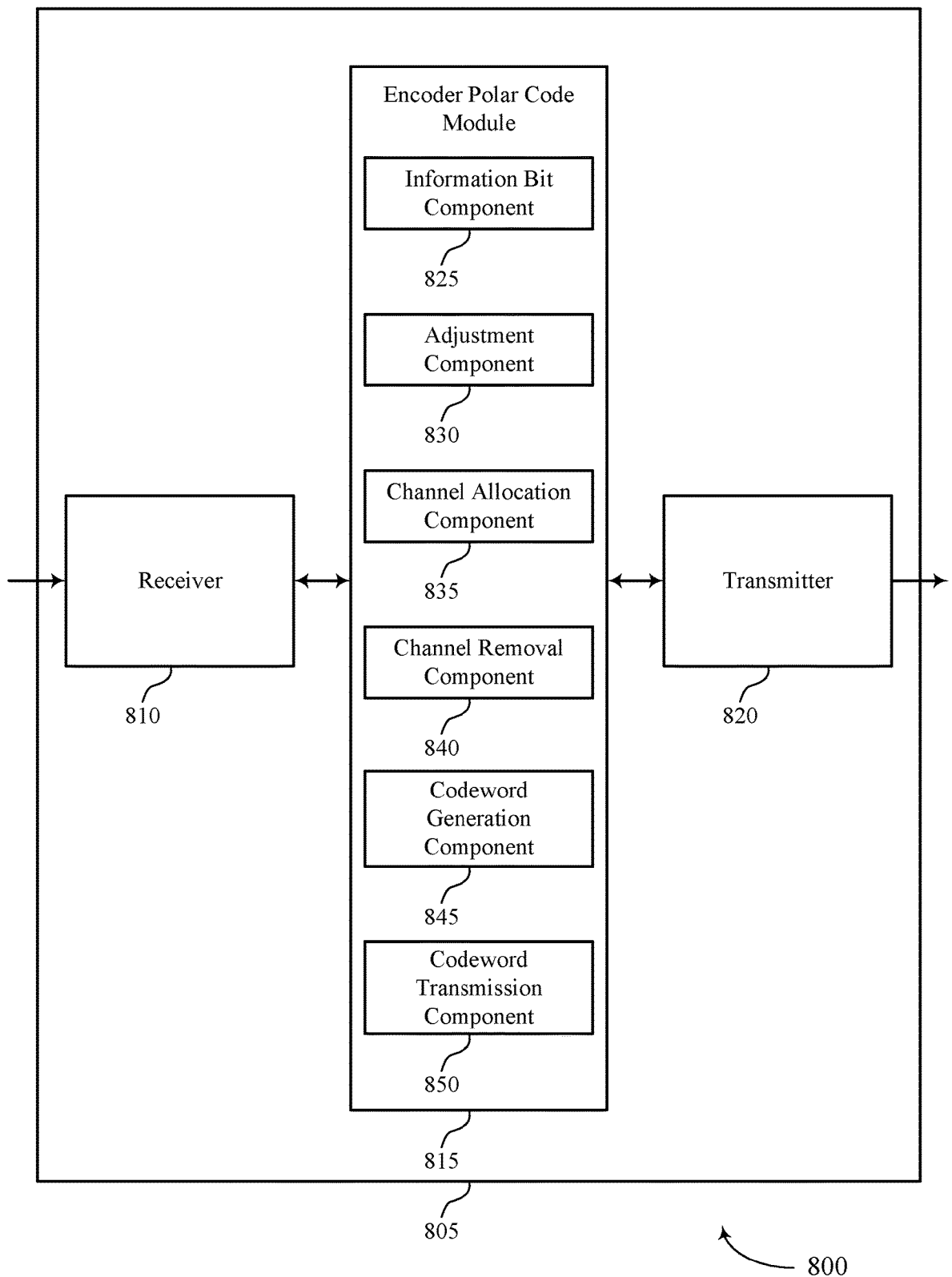

FIG. 8 shows a block diagram 800 of a wireless device 805 that supports adjusted fractally enhanced kernel polar codes for achievable SNR spike mitigation in accordance with aspects of the present disclosure. Wireless device 805 may be an example of aspects of a wireless device 705 or an encoder as described with reference to FIG. 7. Wireless device 805 may include receiver 810, encoder polar code module 815, and transmitter 820. Wireless device 805 may also include a processor. Each of these components may be in communication with one another (e.g., via one or more buses).

Receiver 810 may receive information such as packets, user data, or control information associated with various information channels (e.g., control channels, data channels, and information related to adjusted fractally enhanced kernel polar codes for achievable SNR spike mitigation). Information may be passed on to other components of the device. The receiver 810 may be an example of aspects of the transceiver 1035 described with reference to FIG. 10. The receiver 810 may utilize a single antenna or a set of antennas.

Encoder polar code module 815 may be an example of aspects of the encoder polar code module 1015 described with reference to FIG. 10. Encoder polar code module 815 may also include information bit component 825, adjustment component 830, channel allocation component 835, channel removal component 840, codeword generation component 845, and codeword transmission component 850.

Information bit component 825 may identify a set of information bits including a number of bits for encoding. Adjustment component 830 may determine an aggregate number of information bits for fractally enhanced kernel polar code construction, where the aggregate number of information bits is equal to a sum of the number of bits for encoding and an additional number of bits. In some cases, adjustment component 830 may select the additional number of bits based on a bit selection function. In some cases, the bit selection function is based on a block length, the length of a polar-encoded codeword, a number of punctured bits, or a combination thereof.

Channel allocation component 835 may allocate a total number of information bit channels according to the fractally enhanced kernel polar code construction and the aggregate number of information bits. Channel removal component 840 may remove a number of allocated information bit channels from the total number of information bit channels to obtain a final set of allocated information bit channels, where the number of removed allocated information bit channels is equal to the additional number of bits.

Codeword generation component 845 may generate a polar-encoded codeword based on assigning the set of information bits to the final set of allocated information bit channels. Codeword transmission component 850 may transmit the polar-encoded codeword.

Transmitter 820 may transmit signals generated by other components of the device. In some examples, the transmitter 820 may be collocated with a receiver 810 in a transceiver module. For example, the transmitter 820 may be an example of aspects of the transceiver 1035 described with reference to FIG. 10. The transmitter 820 may utilize a single antenna or a set of antennas.

Figure 9:
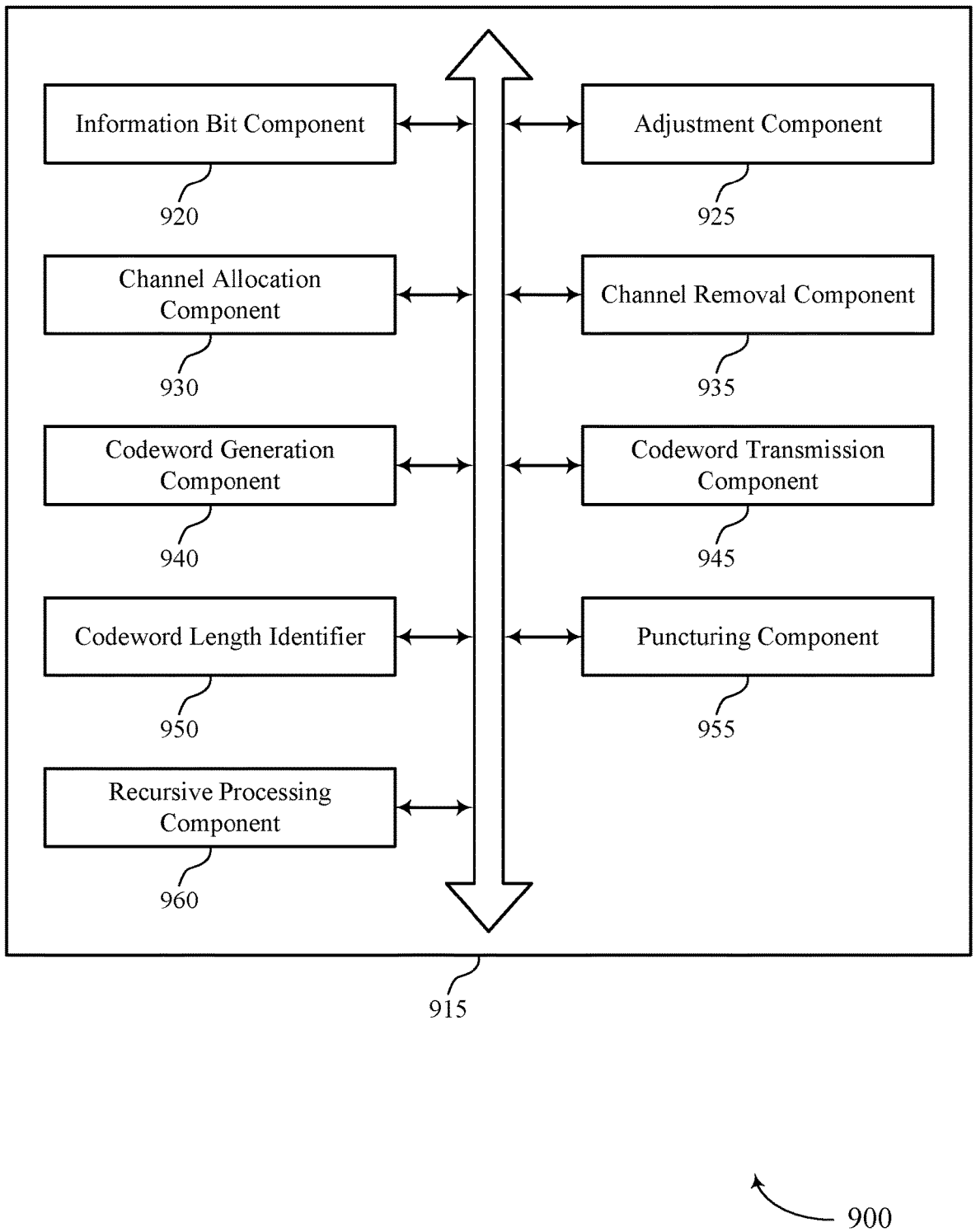

FIG. 9 shows a block diagram 900 of an encoder polar code module 915 that supports adjusted fractally enhanced kernel polar codes for achievable SNR spike mitigation in accordance with aspects of the present disclosure. The encoder polar code module 915 may be an example of aspects of an encoder polar code module 715, an encoder polar code module 815, or an encoder polar code module 1015 described with reference to FIGS. 7, 8, and 10. The encoder polar code module 915 may include information bit component 920, adjustment component 925, channel allocation component 930, channel removal component 935, codeword generation component 940, codeword transmission component 945, codeword length identifier 950, puncturing component 955, and recursive processing component 960. Each of these modules may communicate, directly or indirectly, with one another (e.g., via one or more buses).

Information bit component 920 may identify a set of information bits including a number of bits for encoding. Adjustment component 925 may determine an aggregate number of information bits for fractally enhanced kernel polar code construction, where the aggregate number of information bits is equal to a sum of the number of bits for encoding and an additional number of bits. In some cases, adjustment component 925 may select the additional number of bits based on a bit selection function. In some cases, the bit selection function is based on the block length, the length of the polar-encoded codeword, a number of punctured bits, or a combination thereof.

Channel allocation component 930 may allocate a total number of information bit channels according to the fractally enhanced kernel polar code construction and the aggregate number of information bits. Channel removal component 935 may remove a number of allocated information bit channels from the total number of information bit channels to obtain a final set of allocated information bit channels, where the number of removed allocated information bit channels is equal to the additional number of bits.

Codeword generation component 940 may generate a polar-encoded codeword based on assigning the set of information bits to the final set of allocated information bit channels. Codeword transmission component 945 may transmit the polar-encoded codeword.

Codeword length identifier 950 may identify a block length for the fractally enhanced kernel polar code construction, and may determine a length of the polar-encoded codeword based on the block length.

Puncturing component 955 may puncture one or more bits based on the block length and the length of the polar-encoded codeword.

Recursive processing component 960 may recursively split the length of the polar-encoded codeword into a set of sub-blocks, assign information bits of the aggregate number of information bits to the set of sub-blocks based on mutual information metrics, and allocate the total number of information bit channels based on a number of information bits assigned to each sub-block of the set of sub-blocks. In some cases, recursive processing component 960 may halt the recursive splitting when a sub-block length of each sub-block is less than or equal to a threshold sub-block length. In some cases, each sub-block of the threshold sub-block length includes a pre-determined bit channel reliability order, and generating the polar-encoded codeword includes assigning the set of information bits based on the pre-determined bit channel reliability order and the number of information bits assigned to each sub-block of the set of sub-blocks.

In some cases, channel removal component 935 may divide the set of sub-blocks into a first portion of sub-blocks and a second portion of sub-blocks, where the number of allocated information bit channels are removed from the first portion of sub-blocks. In some cases, puncturing component 955 may puncture one or more bits from the first portion of sub-blocks, where the number of allocated information bit channels are removed from the first portion of sub-blocks based on the puncturing. Channel removal component 935 may calculate an average number of bit channels to remove based on the additional number of bits and a number of sub-blocks in the first portion of sub-blocks, where the number of allocated information bit channels are removed from the first portion of sub-blocks based on the average number of bit channels to remove. In some cases, channel removal component 935 may refrain from removing a last allocated information bit channel from a sub-block. In some cases, the first portion of sub-blocks is a first half of the set of sub-blocks and the second portion of sub-blocks is a second half of the set of sub-blocks. In some cases, removing the number of allocated information bit channels is based on channel capacity values, error probability values, or a combination thereof.

Figure 10:
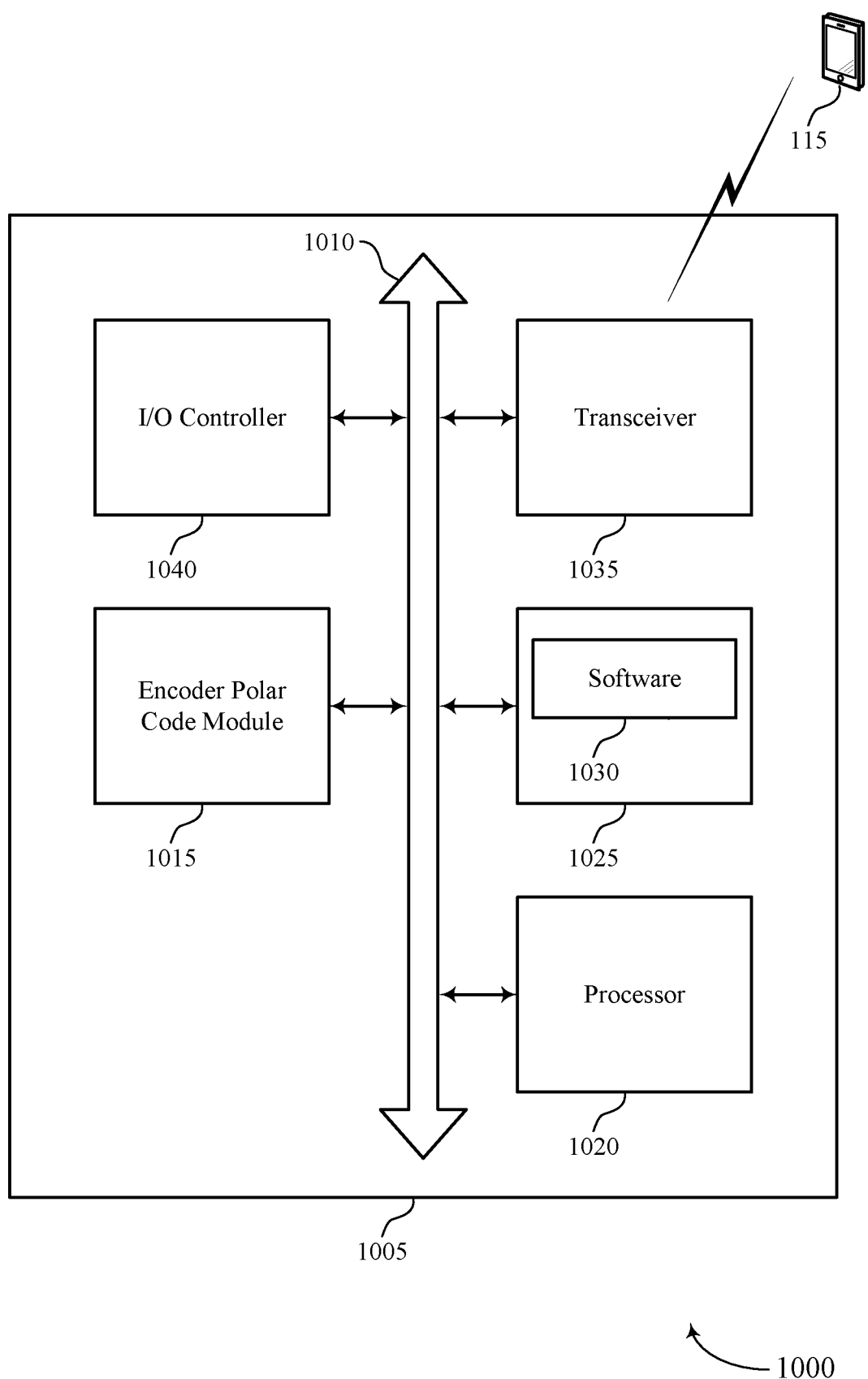
FIG. 10 illustrates a block diagram of a system including a encoder that supports adjusted fractally enhanced kernel polar codes for achievable SNR spike mitigation in accordance with aspects of the present disclosure.

FIG. 10 shows a diagram of a system 1000 including a device 1005 that supports adjusted fractally enhanced kernel polar codes for achievable SNR spike mitigation in accordance with aspects of the present disclosure. Device 1005 may be an example of or include the components of wireless device 705, wireless device 805, or an encoder, as described herein, e.g., with reference to FIGS. 7 and 8. Device 1005 may include components for bi-directional voice and data communications including components for transmitting and receiving communications, including encoder polar code module 1015, processor 1020, memory 1025, software 1030, transceiver 1035, and I/O controller 1040. These components may be in electronic communication via one or more buses (e.g., bus 1010).

Processor 1020 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1020 may be configured to operate a memory array using a memory controller. In other cases, a memory controller may be integrated into processor 1020. Processor 1020 may be configured to execute computer-readable instructions stored in a memory to perform various functions (e.g., functions or tasks supporting adjusted fractally enhanced kernel polar codes for achievable SNR spike mitigation).

Memory 1025 may include random access memory (RAM) and read only memory (ROM). The memory 1025 may store computer-readable, computer-executable software 1030 including instructions that, when executed, cause the processor to perform various functions described herein. In some cases, the memory 1025 may contain, among other things, a basic input/output system (BIOS) which may control basic hardware or software operation such as the interaction with peripheral components or devices.

Software 1030 may include code to implement aspects of the present disclosure, including code to support adjusted fractally enhanced kernel polar codes for achievable SNR spike mitigation. Software 1030 may be stored in a non-transitory computer-readable medium such as system memory or other memory. In some cases, the software 1030 may not be directly executable by the processor but may cause a computer (e.g., when compiled and executed) to perform functions described herein.

Transceiver 1035 may communicate bi-directionally, via one or more antennas, wired, or wireless links as described herein. For example, the transceiver 1035 may represent a wireless transceiver and may communicate bi-directionally with another wireless transceiver. The transceiver 1035 may also include a modem to modulate the packets and provide the modulated packets to the antennas for transmission, and to demodulate packets received from the antennas.

I/O controller 1040 may manage input and output signals for device 1005. I/O controller 1040 may also manage peripherals not integrated into device 1005. In some cases, I/O controller 1040 may represent a physical connection or port to an external peripheral. In some cases, I/O controller 1040 may utilize an operating system such as iOS®, ANDROID®, MS-DOS®, MS-WINDOWS®, OS/2®, UNIX®, LINUX®, or another known operating system. In other cases, I/O controller 1040 may represent or interact with a modem, a keyboard, a mouse, a touchscreen, or a similar device. In some cases, I/O controller 1040 may be implemented as part of a processor. In some cases, a user may interact with device 1005 via I/O controller 1040 or via hardware components controlled by I/O controller 1040.

Figure 11:
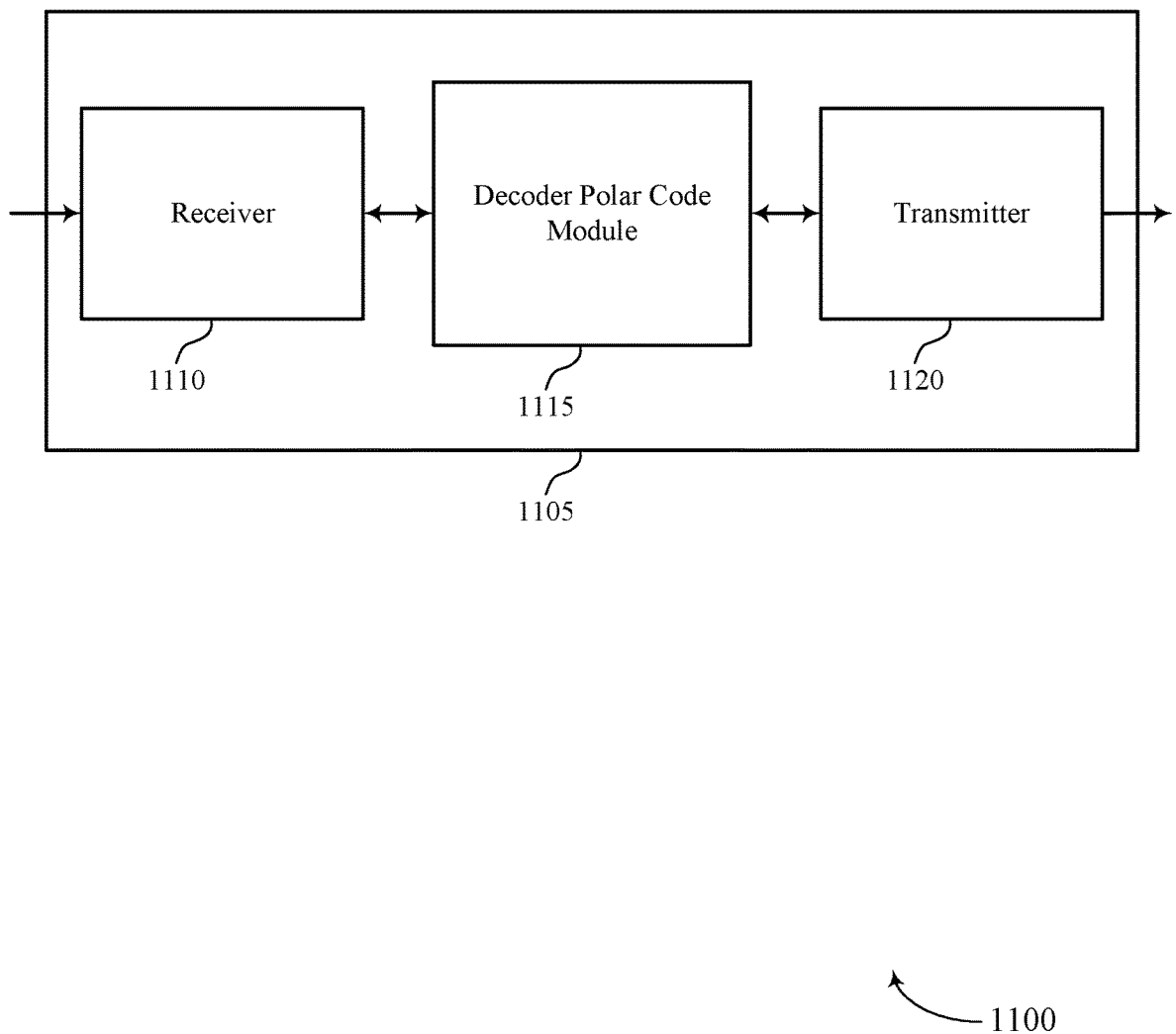
FIGS. 11 through 13 show block diagrams of a device that supports adjusted fractally enhanced kernel polar codes for achievable SNR spike mitigation in accordance with aspects of the present disclosure.

FIG. 11 shows a block diagram 1100 of a wireless device 1105 that supports adjusted fractally enhanced kernel polar codes for achievable SNR spike mitigation in accordance with aspects of the present disclosure. Wireless device 1105 may be an example of aspects of a decoder, which may be a component of a base station 105 or a UE 115, as described herein. Wireless device 1105 may include receiver 1110, decoder polar code module 1115, and transmitter 1120. Wireless device 1105 may also include a processor. Each of these components may be in communication with one another (e.g., via one or more buses).

Receiver 1110 may receive information such as packets, user data, or control information associated with various information channels (e.g., control channels, data channels, and information related to adjusted fractally enhanced kernel polar codes for achievable SNR spike mitigation). Information may be passed on to other components of the device. The receiver 1110 may be an example of aspects of the transceiver 1435 described with reference to FIG. 14. The receiver 1110 may utilize a single antenna or a set of antennas.

Decoder polar code module 1115 may be an example of aspects of the decoder polar code module 1415 described with reference to FIG. 14. Decoder polar code module 1115 and/or at least some of its various sub-components may be implemented in hardware, software executed by a processor, firmware, or any combination thereof. If implemented in software executed by a processor, the functions of the decoder polar code module 1115 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure. The decoder polar code module 1115 and/or at least some of its various sub-components may be physically located at various positions, including being distributed such that portions of functions are implemented at different physical locations by one or more physical devices. In some examples, decoder polar code module 1115 and/or at least some of its various sub-components may be a separate and distinct component in accordance with various aspects of the present disclosure. In other examples, decoder polar code module 1115 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Decoder polar code module 1115 may receive a polar-encoded codeword including a set of encoded information bits, the polar-encoded codeword generated based on a fractally enhanced kernel polar code construction, and may perform a decoding process on the polar-encoded codeword. The decoding process may include determining an aggregate number of information bits, where the aggregate number of information bits is equal to a sum of a number of bits of the set of encoded information bits and an additional number of bits, identifying allocated information bit channels according to the fractally enhanced kernel polar code construction and the aggregate number of information bits, and removing a number of allocated information bit channels from the identified allocated information bit channels to obtain a final set of allocated information bit channels, where the number of removed allocated information bit channels is equal to the additional number of bits. Decoder polar code module 1115 may decode the set of encoded information bits based on the final set of allocated information bit channels.

Transmitter 1120 may transmit signals generated by other components of the device. In some examples, the transmitter 1120 may be collocated with a receiver 1110 in a transceiver module. For example, the transmitter 1120 may be an example of aspects of the transceiver 1435 described with reference to FIG. 14. The transmitter 1120 may utilize a single antenna or a set of antennas.

Figure 12:
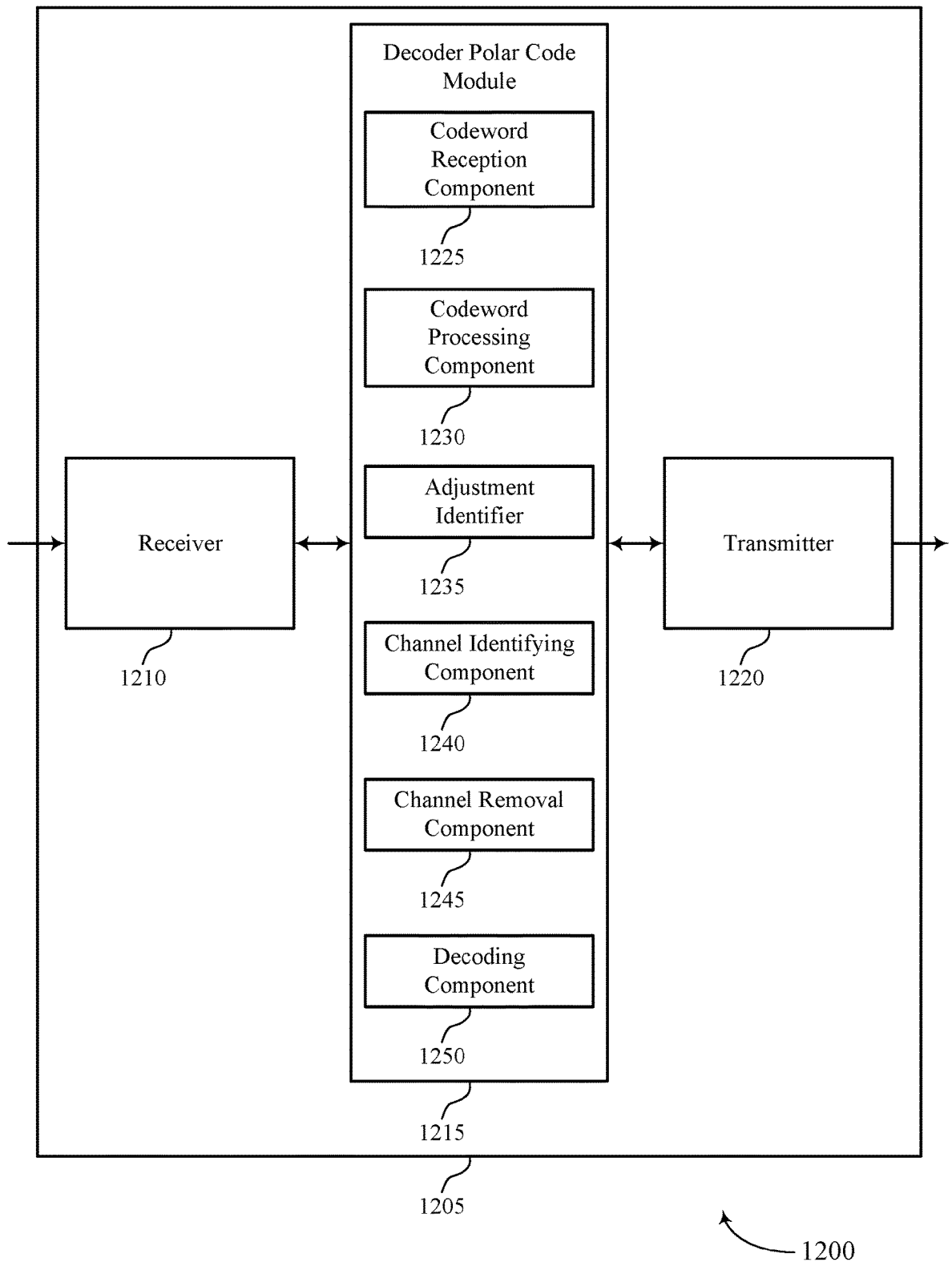

FIG. 12 shows a block diagram 1200 of a wireless device 1205 that supports adjusted fractally enhanced kernel polar codes for achievable SNR spike mitigation in accordance with aspects of the present disclosure. Wireless device 1205 may be an example of aspects of a wireless device 1105 or a decoder as described with reference to FIG. 11. Wireless device 1205 may include receiver 1210, decoder polar code module 1215, and transmitter 1220. Wireless device 1205 may also include a processor. Each of these components may be in communication with one another (e.g., via one or more buses).

Receiver 1210 may receive information such as packets, user data, or control information associated with various information channels (e.g., control channels, data channels, and information related to adjusted fractally enhanced kernel polar codes for achievable SNR spike mitigation). Information may be passed on to other components of the device. The receiver 1210 may be an example of aspects of the transceiver 1435 described with reference to FIG. 14. The receiver 1210 may utilize a single antenna or a set of antennas.

Decoder polar code module 1215 may be an example of aspects of the decoder polar code module 1415 described with reference to FIG. 14. Decoder polar code module 1215 may also include codeword reception component 1225, codeword processing component 1230, adjustment identifier 1235, channel identifying component 1240, channel removal component 1245, and decoding component 1250.

Codeword reception component 1225 may receive a polar-encoded codeword including a set of encoded information bits, the polar-encoded codeword generated based on a fractally enhanced kernel polar code construction. Codeword processing component 1230 may perform a decoding process on the polar-encoded codeword, where the decoding process may include one or more of the following processes or components.

Adjustment identifier 1235 may determine an aggregate number of information bits, where the aggregate number of information bits is equal to a sum of a number of bits of the set of encoded information bits and an additional number of bits. In some cases, adjustment identifier 1235 may determine the additional number of bits based on a bit selection function. In some cases, the bit selection function is based on a block length, a length of the polar-encoded codeword, a number of punctured bits, or a combination thereof.

Channel identifying component 1240 may identify allocated information bit channels according to the fractally enhanced kernel polar code construction and the aggregate number of information bits. Channel removal component 1245 may remove a number of allocated information bit channels from the identified allocated information bit channels to obtain a final set of allocated information bit channels, where the number of removed allocated information bit channels is equal to the additional number of bits.

Decoding component 1250 may decode the set of encoded information bits based on the final set of allocated information bit channels.

Transmitter 1220 may transmit signals generated by other components of the device. In some examples, the transmitter 1220 may be collocated with a receiver 1210 in a transceiver module. For example, the transmitter 1220 may be an example of aspects of the transceiver 1435 described with reference to FIG. 14. The transmitter 1220 may utilize a single antenna or a set of antennas.

Figure 13:
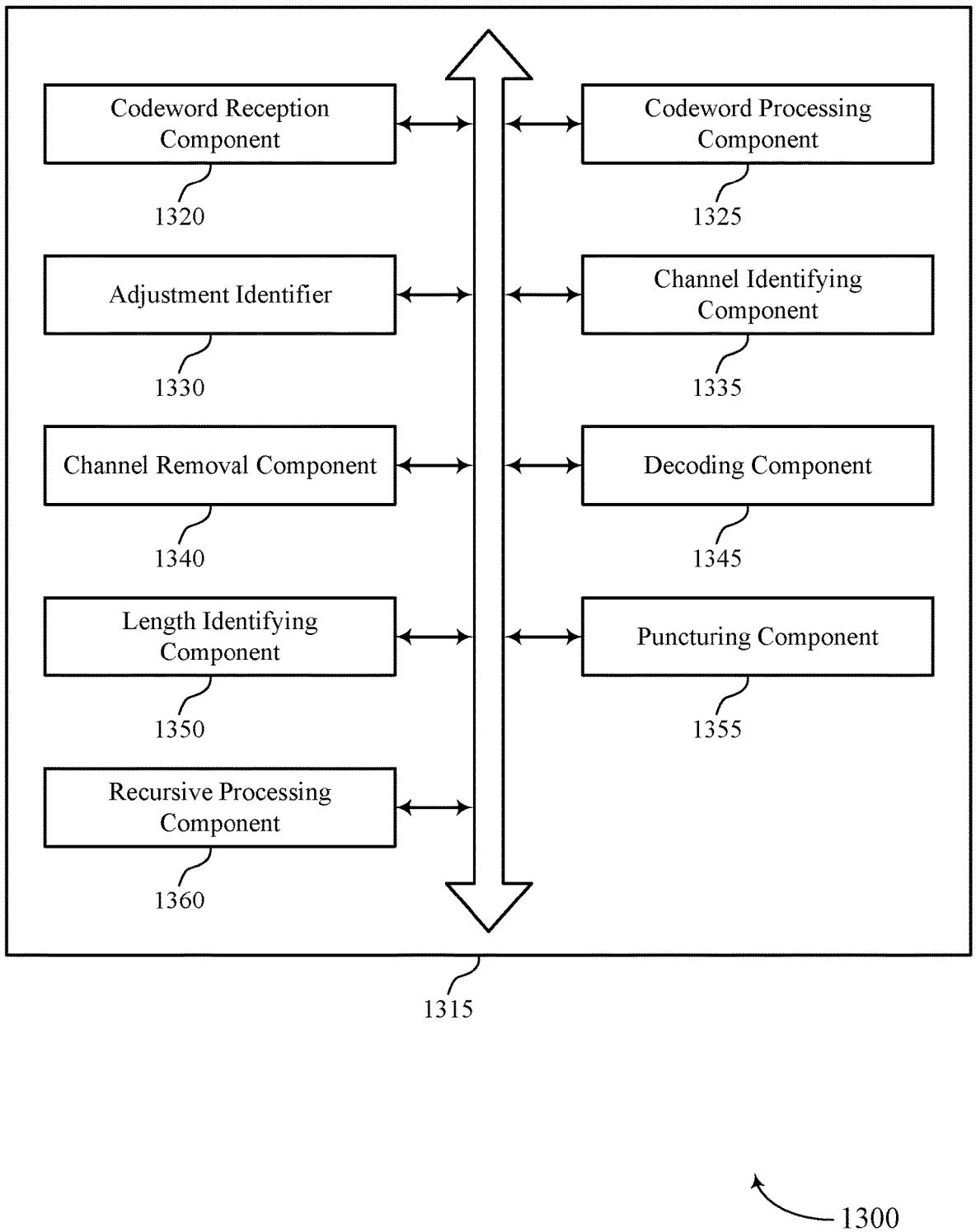

FIG. 13 shows a block diagram 1300 of a decoder polar code module 1315 that supports adjusted fractally enhanced kernel polar codes for achievable SNR spike mitigation in accordance with aspects of the present disclosure. The decoder polar code module 1315 may be an example of aspects of a decoder polar code module 1115, 1215, or 1415 described with reference to FIGS. 11, 12, and 14. The decoder polar code module 1315 may include codeword reception component 1320, codeword processing component 1325, adjustment identifier 1330, channel identifying component 1335, channel removal component 1340, decoding component 1345, length identifying component 1350, puncturing component 1355, and recursive processing component 1360. Each of these modules may communicate, directly or indirectly, with one another (e.g., via one or more buses).

Codeword reception component 1320 may receive a polar-encoded codeword including a set of encoded information bits, the polar-encoded codeword generated based on a fractally enhanced kernel polar code construction. Codeword processing component 1325 may perform a decoding process on the polar-encoded codeword, where the decoding process may include one or more of the following processes or components.

Adjustment identifier 1330 may determine an aggregate number of information bits, where the aggregate number of information bits is equal to a sum of a number of bits of the set of encoded information bits and an additional number of bits. In some cases, adjustment identifier 1330 may determine the additional number of bits based on a bit selection function. In some cases, the bit selection function is based on a block length, a length of the polar-encoded codeword, a number of punctured bits, or a combination thereof.

Channel identifying component 1335 may identify allocated information bit channels according to the fractally enhanced kernel polar code construction and the aggregate number of information bits. Channel removal component 1340 may remove a number of allocated information bit channels from the identified allocated information bit channels to obtain a final set of allocated information bit channels, where the number of removed allocated information bit channels is equal to the additional number of bits.

Decoding component 1345 may decode the set of encoded information bits based on the final set of allocated information bit channels.

Length identifying component 1350 may identify the block length for the fractally enhanced kernel polar code construction and the length of the polar-encoded codeword.

Puncturing component 1355 may determine a number of punctured bits based on the block length and the length of the polar-encoded codeword.

Recursive processing component 1360 may recursively split a length of the polar-encoded codeword into a set of sub-blocks, determine assignments of information bits of the aggregate number of information bits to the set of sub-blocks based on mutual information metrics, and identify the allocated information bit channels based on a number of information bits assigned to each sub-block of the set of sub-blocks. In some cases, recursive processing component 1360 may halt the recursive splitting when a sub-block length of each sub-block is less than or equal to a threshold sub-block length. In some cases, each sub-block of the threshold sub-block length includes a pre-determined bit channel reliability order, where decoding the set of encoded information bits includes determining assignments for the set of encoded information bits based on the pre-determined bit channel reliability order and the number of information bits assigned to each sub-block of the set of sub-blocks.

In some cases, channel removal component 1340 may divide the set of sub-blocks into a first portion of sub-blocks and a second portion of sub-blocks, where the number of allocated information bit channels are removed from the first portion of sub-blocks. Puncturing component 1355 may identify a set of punctured bits in the first portion of sub-blocks, where the number of allocated information bit channels are removed from the first portion of sub-blocks based on the identified set of punctured bits. In some cases, channel removal component 1340 may calculate an average number of bit channels to remove based on the additional number of bits and a number of sub-blocks in the first portion of sub-blocks, where the number of allocated information bit channels are removed from the first portion of sub-blocks based on the average number of bit channels to remove. Channel removal component 1340 may refrain from removing a last allocated information bit channel from a sub-block. In some cases, the first portion of sub-blocks is a first half of the set of sub-blocks and the second portion of sub-blocks is a second half of the set of sub-blocks. In some cases, removing the number of allocated information bit channels is based on channel capacity values, error probability values, or a combination thereof.

Figure 14:
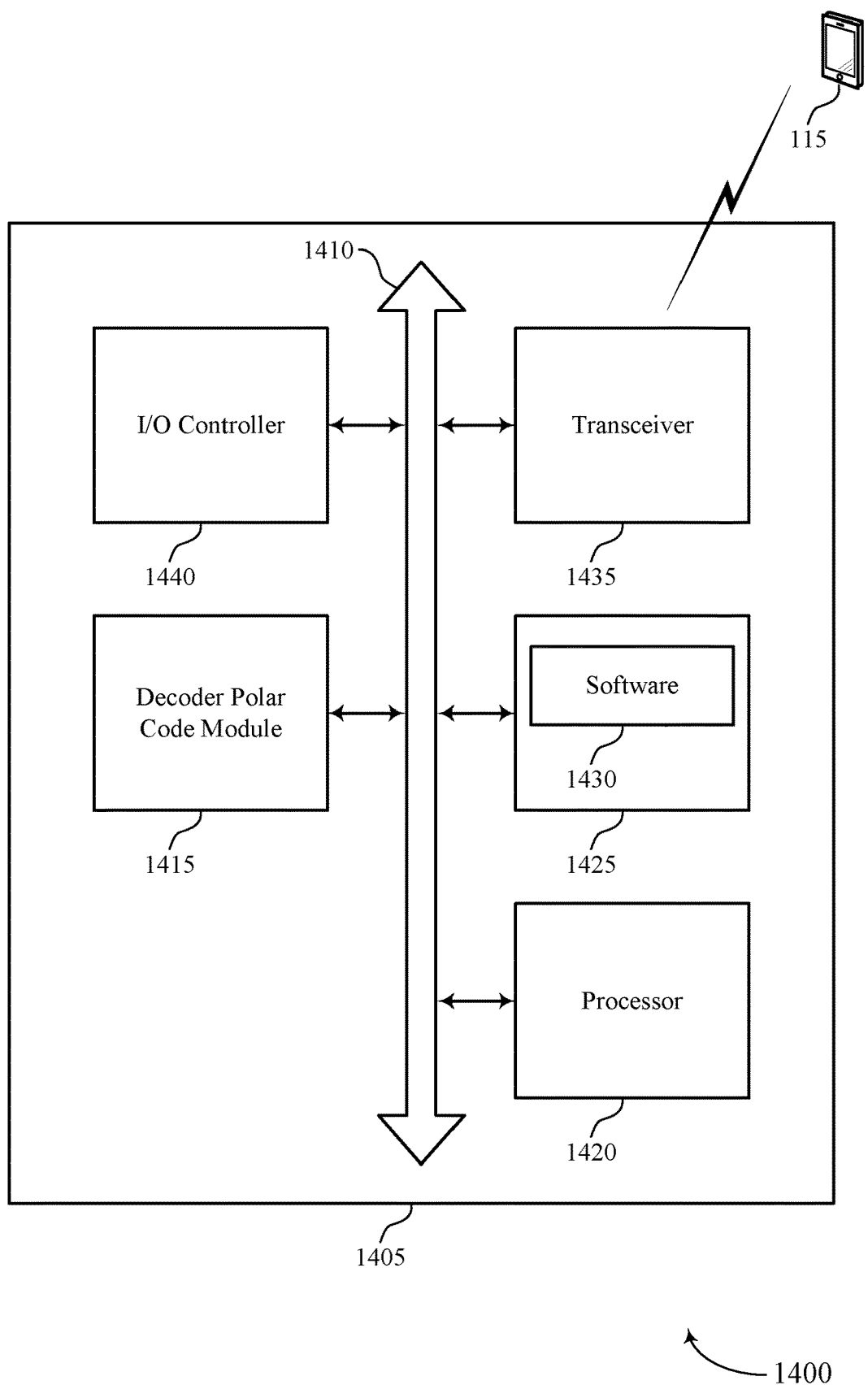
FIG. 14 illustrates a block diagram of a system including a decoder that supports adjusted fractally enhanced kernel polar codes for achievable SNR spike mitigation in accordance with aspects of the present disclosure.

FIG. 14 shows a diagram of a system 1400 including a device 1405 that supports adjusted fractally enhanced kernel polar codes for achievable SNR spike mitigation in accordance with aspects of the present disclosure. Device 1405 may be an example of or include the components of a decoder as described herein. Device 1405 may include components for bi-directional voice and data communications including components for transmitting and receiving communications, including decoder polar code module 1415, processor 1420, memory 1425, software 1430, transceiver 1435, and I/O controller 1440. These components may be in electronic communication via one or more buses (e.g., bus 1410).

Processor 1420 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1420 may be configured to operate a memory array using a memory controller. In other cases, a memory controller may be integrated into processor 1420. Processor 1420 may be configured to execute computer-readable instructions stored in a memory to perform various functions (e.g., functions or tasks supporting adjusted fractally enhanced kernel polar codes for achievable SNR spike mitigation).

Memory 1425 may include RAM and ROM. The memory 1425 may store computer-readable, computer-executable software 1430 including instructions that, when executed, cause the processor to perform various functions described herein. In some cases, the memory 1425 may contain, among other things, a BIOS which may control basic hardware or software operation such as the interaction with peripheral components or devices.

Software 1430 may include code to implement aspects of the present disclosure, including code to support adjusted fractally enhanced kernel polar codes for achievable SNR spike mitigation. Software 1430 may be stored in a non-transitory computer-readable medium such as system memory or other memory. In some cases, the software 1430 may not be directly executable by the processor but may cause a computer (e.g., when compiled and executed) to perform functions described herein.

Transceiver 1435 may communicate bi-directionally, via one or more antennas, wired, or wireless links as described herein. For example, the transceiver 1435 may represent a wireless transceiver and may communicate bi-directionally with another wireless transceiver. The transceiver 1435 may also include a modem to modulate the packets and provide the modulated packets to the antennas for transmission, and to demodulate packets received from the antennas.

I/O controller 1440 may manage input and output signals for device 1405. I/O controller 1440 may also manage peripherals not integrated into device 1405. In some cases, I/O controller 1440 may represent a physical connection or port to an external peripheral. In some cases, I/O controller 1440 may utilize an operating system such as iOS®, ANDROID®, MS-DOS®, MS-WINDOWS®, OS/2®, UNIX®, LINUX®, or another known operating system. In other cases, I/O controller 1440 may represent or interact with a modem, a keyboard, a mouse, a touchscreen, or a similar device. In some cases, I/O controller 1440 may be implemented as part of a processor. In some cases, a user may interact with device 1405 via I/O controller 1440 or via hardware components controlled by I/O controller 1440.

Figure 15:
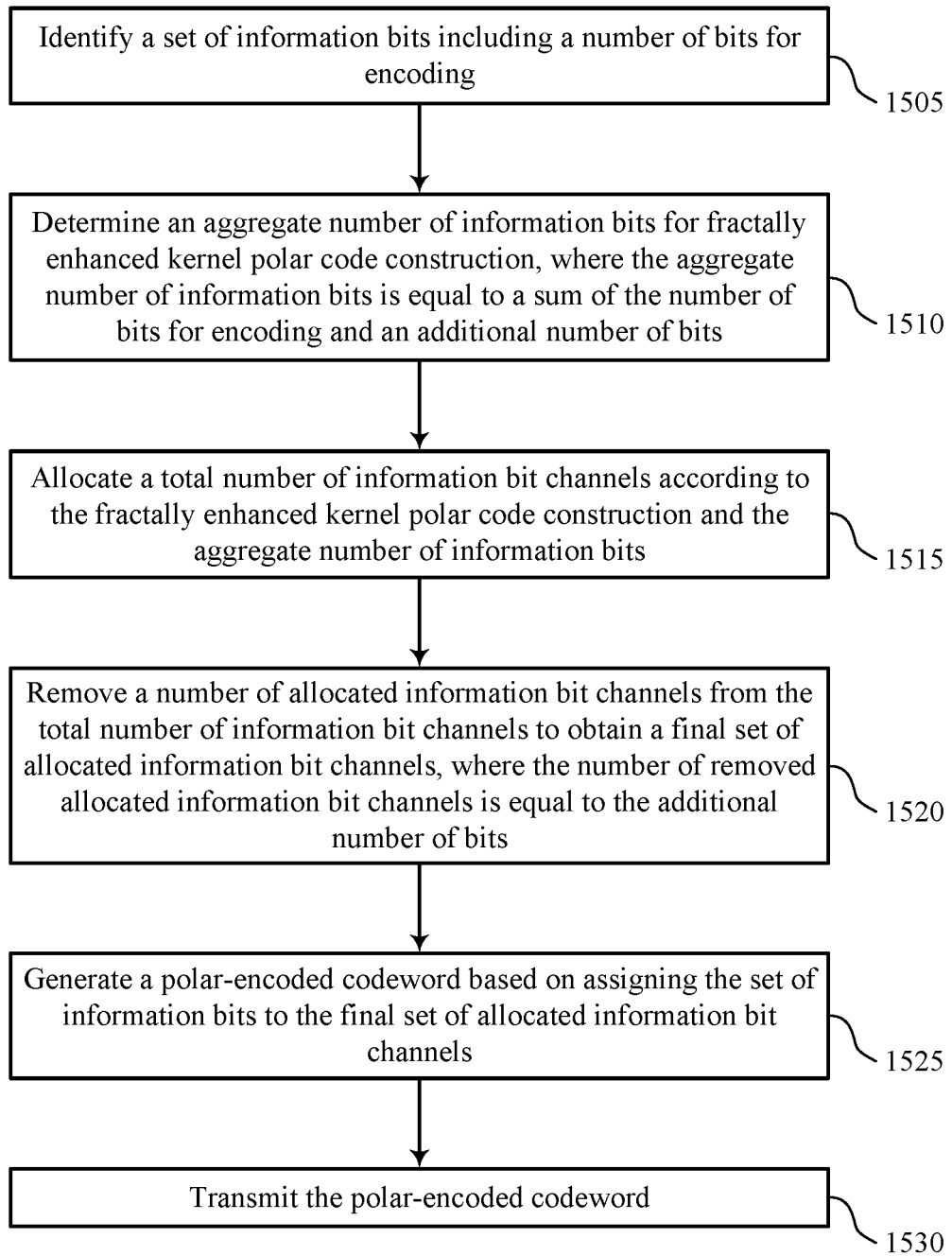
FIGS. 15 through 18 illustrate methods for adjusted fractally enhanced kernel polar codes for achievable SNR spike mitigation in accordance with aspects of the present disclosure.

FIG. 15 shows a flowchart illustrating a method 1500 for adjusted fractally enhanced kernel polar codes for achievable SNR spike mitigation in accordance with aspects of the present disclosure. The operations of method 1500 may be implemented by an encoder or its components as described herein. For example, the operations of method 1500 may be performed by an encoder polar code module as described with reference to FIGS. 7 through 10. In some examples, an encoder may execute a set of codes to control the functional elements of the device to perform the functions described herein. Additionally or alternatively, the encoder may perform aspects of the functions described herein using special-purpose hardware.

At 1505 the encoder may identify a plurality of information bits including a number of bits for encoding. The operations of 1505 may be performed according to the methods described herein. In certain examples, aspects of the operations of 1505 may be performed by an information bit component as described with reference to FIGS. 7 through 10.

At 1510 the encoder may determine an aggregate number of information bits for fractally enhanced kernel polar code construction, where the aggregate number of information bits is equal to a sum of the number of bits for encoding and an additional number of bits. The operations of 1510 may be performed according to the methods described herein. In certain examples, aspects of the operations of 1510 may be performed by an adjustment component as described with reference to FIGS. 7 through 10.

At 1515 the encoder may allocate a total number of information bit channels according to the fractally enhanced kernel polar code construction and the aggregate number of information bits. The operations of 1515 may be performed according to the methods described herein. In certain examples, aspects of the operations of 1515 may be performed by a channel allocation component as described with reference to FIGS. 7 through 10.

At 1520 the encoder may remove a number of allocated information bit channels from the total number of information bit channels to obtain a final set of allocated information bit channels, where the number of removed allocated information bit channels is equal to the additional number of bits. The operations of 1520 may be performed according to the methods described herein. In certain examples, aspects of the operations of 1520 may be performed by a channel removal component as described with reference to FIGS. 7 through 10.

At 1525 the encoder may generate a polar-encoded codeword based on assigning the plurality of information bits to the final set of allocated information bit channels. The operations of 1525 may be performed according to the methods described herein. In certain examples, aspects of the operations of 1525 may be performed by a codeword generation component as described with reference to FIGS. 7 through 10.

At 1530 the encoder may transmit the polar-encoded codeword. The operations of 1530 may be performed according to the methods described herein. In certain examples, aspects of the operations of 1530 may be performed by a codeword transmission component as described with reference to FIGS. 7 through 10.

Figure 16:
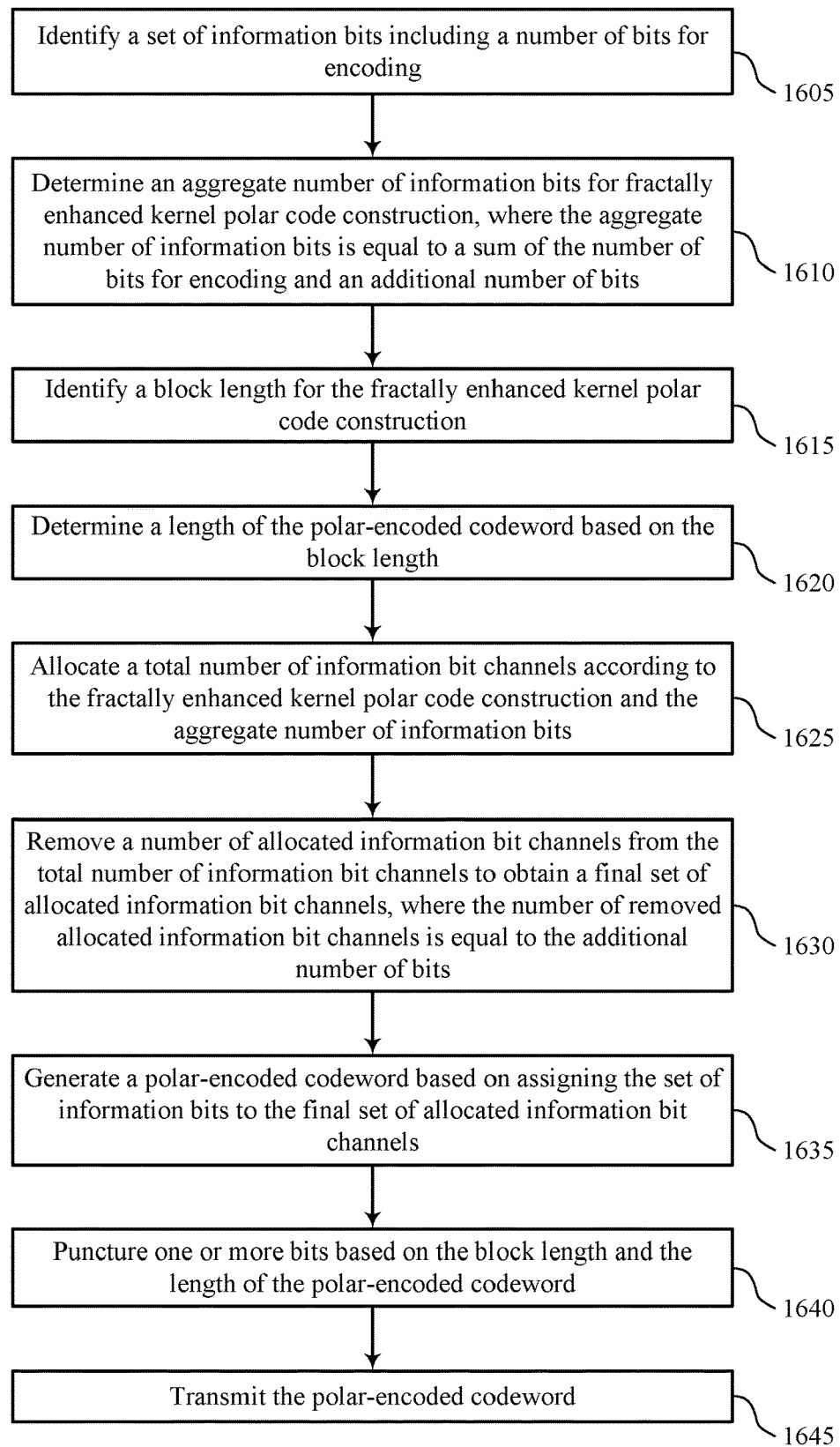

FIG. 16 shows a flowchart illustrating a method 1600 for adjusted fractally enhanced kernel polar codes for achievable SNR spike mitigation in accordance with aspects of the present disclosure. The operations of method 1600 may be implemented by an encoder or its components as described herein. For example, the operations of method 1600 may be performed by an encoder polar code module as described with reference to FIGS. 7 through 10. In some examples, an encoder may execute a set of codes to control the functional elements of the device to perform the functions described herein. Additionally or alternatively, the encoder may perform aspects of the functions described herein using special-purpose hardware.

At 1605 the encoder may identify a plurality of information bits including a number of bits for encoding. The operations of 1605 may be performed according to the methods described herein. In certain examples, aspects of the operations of 1605 may be performed by an information bit component as described with reference to FIGS. 7 through 10.

At 1610 the encoder may determine an aggregate number of information bits for fractally enhanced kernel polar code construction, where the aggregate number of information bits is equal to a sum of the number of bits for encoding and an additional number of bits. The operations of 1610 may be performed according to the methods described herein. In certain examples, aspects of the operations of 1610 may be performed by an adjustment component as described with reference to FIGS. 7 through 10.

At 1615 the encoder may identify a block length for the fractally enhanced kernel polar code construction. The operations of 1615 may be performed according to the methods described herein. In certain examples, aspects of the operations of 1615 may be performed by a codeword length identifier as described with reference to FIGS. 7 through 10.

At 1620 the encoder may determine a length of the polar-encoded codeword based on the block length. The operations of 1620 may be performed according to the methods described herein. In certain examples, aspects of the operations of 1620 may be performed by a codeword length identifier as described with reference to FIGS. 7 through 10.

At 1625 the encoder may allocate a total number of information bit channels according to the fractally enhanced kernel polar code construction and the aggregate number of information bits. The operations of 1625 may be performed according to the methods described herein. In certain examples, aspects of the operations of 1625 may be performed by a channel allocation component as described with reference to FIGS. 7 through 10.

At 1630 the encoder may remove a number of allocated information bit channels from the total number of information bit channels to obtain a final set of allocated information bit channels, where the number of removed allocated information bit channels is equal to the additional number of bits. The operations of 1630 may be performed according to the methods described herein. In certain examples, aspects of the operations of 1630 may be performed by a channel removal component as described with reference to FIGS. 7 through 10.

At 1635 the encoder may generate a polar-encoded codeword based on assigning the plurality of information bits to the final set of allocated information bit channels. The operations of 1635 may be performed according to the methods described herein. In certain examples, aspects of the operations of 1635 may be performed by a codeword generation component as described with reference to FIGS. 7 through 10.

At 1640 the encoder may puncture one or more bits based on the block length and the length of the polar-encoded codeword. The operations of 1640 may be performed according to the methods described herein. In certain examples, aspects of the operations of 1640 may be performed by a puncturing component as described with reference to FIGS. 7 through 10.

At 1645 the encoder may transmit the polar-encoded codeword. The operations of 1645 may be performed according to the methods described herein. In certain examples, aspects of the operations of 1645 may be performed by a codeword transmission component as described with reference to FIGS. 7 through 10.

Figure 17:
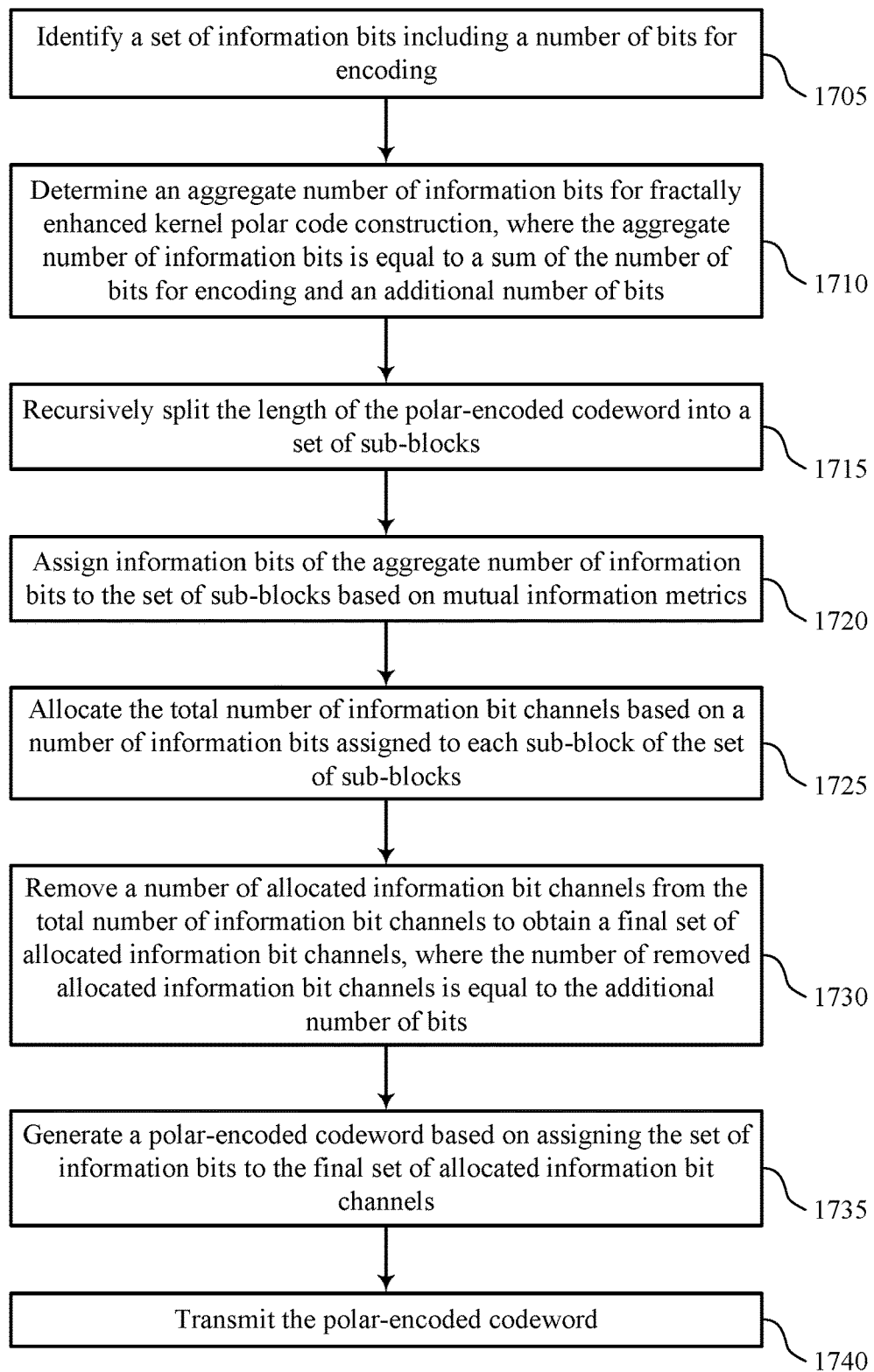

FIG. 17 shows a flowchart illustrating a method 1700 for adjusted fractally enhanced kernel polar codes for achievable SNR spike mitigation in accordance with aspects of the present disclosure. The operations of method 1700 may be implemented by an encoder or its components as described herein. For example, the operations of method 1700 may be performed by an encoder polar code module as described with reference to FIGS. 7 through 10. In some examples, an encoder may execute a set of codes to control the functional elements of the device to perform the functions described herein. Additionally or alternatively, the encoder may perform aspects of the functions described herein using special-purpose hardware.

At 1705 the encoder may identify a plurality of information bits including a number of bits for encoding. The operations of 1705 may be performed according to the methods described herein. In certain examples, aspects of the operations of 1705 may be performed by an information bit component as described with reference to FIGS. 7 through 10.

At 1710 the encoder may determine an aggregate number of information bits for fractally enhanced kernel polar code construction, where the aggregate number of information bits is equal to a sum of the number of bits for encoding and an additional number of bits. The operations of 1710 may be performed according to the methods described herein. In certain examples, aspects of the operations of 1710 may be performed by an adjustment component as described with reference to FIGS. 7 through 10.

The encoder may allocate a total number of information bit channels according to the fractally enhanced kernel polar code construction and the aggregate number of information bits. For example, at 1715 the encoder may recursively split the length of the polar-encoded codeword into a plurality of sub-blocks. The operations of 1715 may be performed according to the methods described herein. In certain examples, aspects of the operations of 1715 may be performed by a recursive processing component as described with reference to FIGS. 7 through 10.

At 1720 the encoder may assign information bits of the aggregate number of information bits to the plurality of sub-blocks based on mutual information metrics. The operations of 1720 may be performed according to the methods described herein. In certain examples, aspects of the operations of 1720 may be performed by a recursive processing component as described with reference to FIGS. 7 through 10.

At 1725 the encoder may allocate the total number of information bit channels based on a number of information bits assigned to each sub-block of the plurality of sub-blocks. The operations of 1725 may be performed according to the methods described herein. In certain examples, aspects of the operations of 1725 may be performed by a recursive processing component as described with reference to FIGS. 7 through 10.

At 1730 the encoder may remove a number of allocated information bit channels from the total number of information bit channels to obtain a final set of allocated information bit channels, where the number of removed allocated information bit channels is equal to the additional number of bits. The operations of 1730 may be performed according to the methods described herein. In certain examples, aspects of the operations of 1730 may be performed by a channel removal component as described with reference to FIGS. 7 through 10.

At 1735 the encoder may generate a polar-encoded codeword based on assigning the plurality of information bits to the final set of allocated information bit channels. The operations of 1735 may be performed according to the methods described herein. In certain examples, aspects of the operations of 1735 may be performed by a codeword generation component as described with reference to FIGS. 7 through 10.

At 1740 the encoder may transmit the polar-encoded codeword. The operations of 1740 may be performed according to the methods described herein. In certain examples, aspects of the operations of 1740 may be performed by a codeword transmission component as described with reference to FIGS. 7 through 10.

Figure 18:
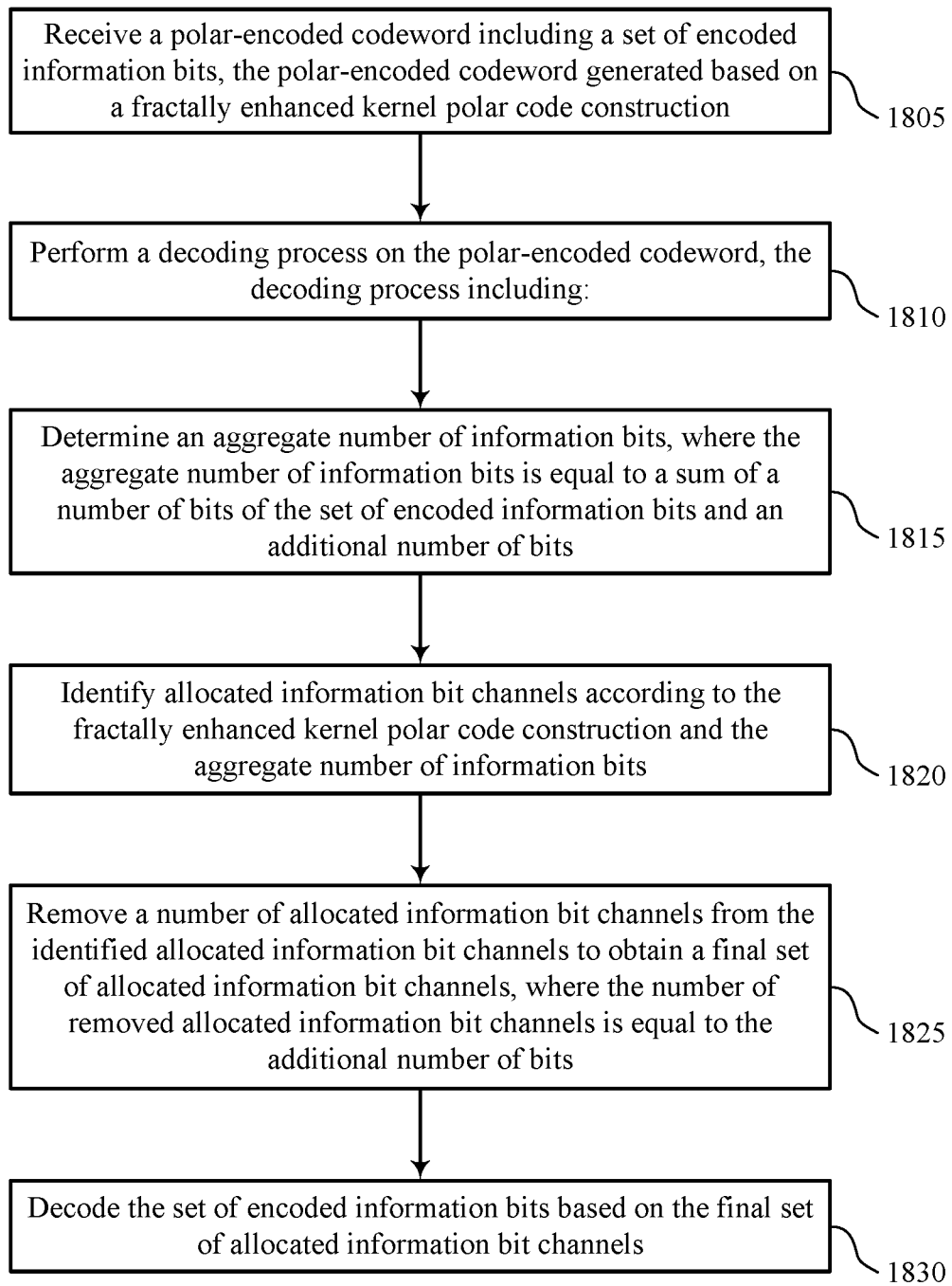

FIG. 18 shows a flowchart illustrating a method 1800 for adjusted fractally enhanced kernel polar codes for achievable SNR spike mitigation in accordance with aspects of the present disclosure. The operations of method 1800 may be implemented by a decoder or its components as described herein. For example, the operations of method 1800 may be performed by a decoder polar code module as described with reference to FIGS. 11 through 14. In some examples, a decoder may execute a set of codes to control the functional elements of the device to perform the functions described herein. Additionally or alternatively, the decoder may perform aspects of the functions described herein using special-purpose hardware.

At 1805 the decoder may receive a polar-encoded codeword including a plurality of encoded information bits, the polar-encoded codeword generated based on a fractally enhanced kernel polar code construction. The operations of 1805 may be performed according to the methods described herein. In certain examples, aspects of the operations of 1805 may be performed by a codeword reception component as described with reference to FIGS. 11 through 14.

At 1810 the decoder may perform a decoding process on the polar-encoded codeword. The decoding process may include one or more further processes, including the processes described herein with respect to 1815, 1820, 1825, 1830, or any combination of these. The operations of 1810 may be performed according to the methods described herein. In certain examples, aspects of the operations of 1810 may be performed by a codeword processing component as described with reference to FIGS. 11 through 14.

At 1815 the decoder may determine an aggregate number of information bits, where the aggregate number of information bits is equal to a sum of a number of bits of the plurality of encoded information bits and an additional number of bits. The operations of 1815 may be performed according to the methods described herein. In certain examples, aspects of the operations of 1815 may be performed by an adjustment identifier as described with reference to FIGS. 11 through 14.

At 1820 the decoder may identify allocated information bit channels according to the fractally enhanced kernel polar code construction and the aggregate number of information bits. The operations of 1820 may be performed according to the methods described herein. In certain examples, aspects of the operations of 1820 may be performed by a channel identifying component as described with reference to FIGS. 11 through 14.

At 1825 the decoder may remove a number of allocated information bit channels from the identified allocated information bit channels to obtain a final set of allocated information bit channels, where the number of removed allocated information bit channels is equal to the additional number of bits. The operations of 1825 may be performed according to the methods described herein. In certain examples, aspects of the operations of 1825 may be performed by a channel removal component as described with reference to FIGS. 11 through 14.

At 1830 the decoder may decode the plurality of encoded information bits based on the final set of allocated information bit channels. The operations of 1830 may be performed according to the methods described herein. In certain examples, aspects of the operations of 1830 may be performed by a decoding component as described with reference to FIGS. 11 through 14.

It should be noted that the methods described herein describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned herein as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs 115 with service subscriptions with the network provider. A small cell may be associated with a lower-powered base station 105, as compared with a macro cell, and a small cell may operate in the same or different (e.g., licensed, unlicensed) frequency bands as macro cells. Small cells may include pico cells, femto cells, and micro cells according to various examples.

A pico cell, for example, may cover a small geographic area and may allow unrestricted access by UEs 115 with service subscriptions with the network provider. A femto cell may also cover a small geographic area (e.g., a home) and may provide restricted access by UEs 115 having an association with the femto cell (e.g., UEs 115 in a closed subscriber group (CSG), UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications system 100 or systems described herein may support synchronous or asynchronous operation. For synchronous operation, the base stations 105 may have similar frame timing, and transmissions from different base stations 105 may be approximately aligned in time. For asynchronous operation, the base stations 105 may have different frame timing, and transmissions from different base stations 105 may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include random-access memory (RAM), read-only memory (ROM), electrically erasable programmable read only memory (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
    identifying a plurality of information bits comprising a number of bits for encoding;
    determining an aggregate number of information bits for fractally enhanced kernel polar code construction, wherein the aggregate number of information bits is equal to a sum of the number of bits for encoding and an additional number of bits;
    allocating a total number of information bit channels according to the fractally enhanced kernel polar code construction and the aggregate number of information bits;
    removing a number of allocated information bit channels from the total number of information bit channels to obtain a final set of allocated information bit channels, wherein the number of removed allocated information bit channels is equal to the additional number of bits;
    generating a polar-encoded codeword based at least in part on assigning the plurality of information bits to the final set of allocated information bit channels; and
    transmitting the polar-encoded codeword.

2. The method of claim 1, further comprising:
    identifying a block length for the fractally enhanced kernel polar code construction; and
    determining a length of the polar-encoded codeword based at least in part on the block length.

3. The method of claim 2, further comprising:
    puncturing one or more bits based at least in part on the block length and the length of the polar-encoded codeword.

4. The method of any of claim 2 or 3, wherein allocating the total number of information bit channels comprises:
    recursively splitting the length of the polar-encoded codeword into a plurality of sub-blocks;
    assigning information bits of the aggregate number of information bits to the plurality of sub-blocks based at least in part on mutual information metrics; and
    allocating the total number of information bit channels based at least in part on a number of information bits assigned to each sub-block of the plurality of sub-blocks.

5. The method of claim 4, further comprising:
    dividing the plurality of sub-blocks into a first portion of sub-blocks and a second portion of sub-blocks, wherein the number of allocated information bit channels are removed from the first portion of sub-blocks.

6. The method of claim 5, further comprising:
    puncturing one or more bits from the first portion of sub-blocks, wherein the number of allocated information bit channels are removed from the first portion of sub-blocks based at least in part on the puncturing.

7. The method of any of claim 5 or 6, further comprising:
    calculating an average number of bit channels to remove based at least in part on the additional number of bits and a number of sub-blocks in the first portion of sub-blocks, wherein the number of allocated information bit channels are removed from the first portion of sub-blocks based at least in part on the average number of bit channels to remove.

8. The method of any of claims 5-7, further comprising:
    refraining from removing a last allocated information bit channel from a sub-block.

9. The method of any of claims 5-8, wherein the first portion of sub-blocks is a first half of the plurality of sub-blocks and the second portion of sub-blocks is a second half of the plurality of sub-blocks.

10. The method of any of claims 4-9, further comprising:
halting the recursive splitting when a sub-block length of each sub-block is less than or equal to a threshold sub-block length.

11. The method of claim 10, wherein each sub-block of the threshold sub-block length comprises a pre-determined bit channel reliability order, and wherein generating the polar-encoded codeword comprises:
assigning the plurality of information bits based at least in part on the pre-determined bit channel reliability order and the number of information bits assigned to each sub-block of the plurality of sub-blocks.

12. The method of any of claims 2-11, further comprising:
selecting the additional number of bits based at least in part on a bit selection function.

13. The method of claim 12, wherein the bit selection function is based at least in part on the block length, the length of the polar-encoded codeword, a number of punctured bits, or a combination thereof.

14. The method of any of claims 1-13, wherein removing the number of allocated information bit channels is based at least in part on channel capacity values, error probability values, or a combination thereof.

15. A method for wireless communication, comprising:
receiving a polar-encoded codeword comprising a plurality of encoded information bits, the polar-encoded codeword generated based at least in part on a fractally enhanced kernel polar code construction; and
performing a decoding process on the polar-encoded codeword, the decoding process comprising:
determining an aggregate number of information bits, wherein the aggregate number of information bits is equal to a sum of a number of bits of the plurality of encoded information bits and an additional number of bits;
identifying allocated information bit channels according to the fractally enhanced kernel polar code construction and the aggregate number of information bits;
removing a number of allocated information bit channels from the identified allocated information bit channels to obtain a final set of allocated information bit channels, wherein the number of removed allocated information bit channels is equal to the additional number of bits; and
decoding the plurality of encoded information bits based at least in part on the final set of allocated information bit channels.

16. The method of claim 15, further comprising:
identifying a block length for the fractally enhanced kernel polar code construction and a length of the polar-encoded codeword.

17. The method of claim 16, further comprising:
determining a number of punctured bits based at least in part on the block length and the length of the polar-encoded codeword.

18. The method of any of claim 16 or 17, further comprising:
determining the additional number of bits based at least in part on a bit selection function.

19. The method of claim 18, wherein the bit selection function is based at least in part on the block length, the length of the polar-encoded codeword, a number of punctured bits, or a combination thereof.

20. The method of any of claims 15-19, wherein identifying the allocated information bit channels comprises:
recursively splitting a length of the polar-encoded codeword into a plurality of sub-blocks;
determining assignments of information bits of the aggregate number of information bits to the plurality of sub-blocks based at least in part on mutual information metrics; and
identifying the allocated information bit channels based at least in part on a number of information bits assigned to each sub-block of the plurality of sub-blocks.

21. The method of claim 20, further comprising:
dividing the plurality of sub-blocks into a first portion of sub-blocks and a second portion of sub-blocks, wherein the number of allocated information bit channels are removed from the first portion of sub-blocks.

22. The method of claim 21, further comprising:
identifying a set of punctured bits in the first portion of sub-blocks, wherein the number of allocated information bit channels are removed from the first portion of sub-blocks based at least in part on the identified set of punctured bits.

23. The method of any of claim 21 or 22, further comprising:
calculating an average number of bit channels to remove based at least in part on the additional number of bits and a number of sub-blocks in the first portion of sub-blocks, wherein the number of allocated information bit channels are removed from the first portion of sub-blocks based at least in part on the average number of bit channels to remove.

24. The method of any of claims 21-23, further comprising:
refraining from removing a last allocated information bit channel from a sub-block.

25. The method of any of claims 21-24, wherein the first portion of sub-blocks is a first half of the plurality of sub-blocks and the second portion of sub-blocks is a second half of the plurality of sub-blocks.

26. The method of any of claims 20-25, further comprising:
halting the recursive splitting when a sub-block length of each sub-block is less than or equal to a threshold sub-block length.

27. The method of claim 26, wherein each sub-block of the threshold sub-block length comprises a pre-determined bit channel reliability order, and wherein decoding the plurality of encoded information bits comprises:
determining assignments for the plurality of encoded information bits based at least in part on the pre-determined bit channel reliability order and the number of information bits assigned to each sub-block of the plurality of sub-blocks.

28. The method of any of claims 15-27, wherein removing the number of allocated information bit channels is based at least in part on channel capacity values, error probability values, or a combination thereof.

29. An apparatus for wireless communication, comprising:
means for identifying a plurality of information bits comprising a number of bits for encoding;
means for determining an aggregate number of information bits for fractally enhanced kernel polar code construction, wherein the aggregate number of information bits is equal to a sum of the number of bits for encoding and an additional number of bits;

means for allocating a total number of information bit channels according to the fractally enhanced kernel polar code construction and the aggregate number of information bits;
means for removing a number of allocated information bit channels from the total number of information bit channels to obtain a final set of allocated information bit channels, wherein the number of removed allocated information bit channels is equal to the additional number of bits;
means for generating a polar-encoded codeword based at least in part on assigning the plurality of information bits to the final set of allocated information bit channels; and
means for transmitting the polar-encoded codeword.

30. An apparatus for wireless communication, comprising:
means for receiving a polar-encoded codeword comprising a plurality of encoded information bits, the polar-encoded codeword generated based at least in part on a fractally enhanced kernel polar code construction; and
means for performing a decoding process on the polar-encoded codeword, the decoding process comprising:
means for determining an aggregate number of information bits, wherein the aggregate number of information bits is equal to a sum of a number of bits of the plurality of encoded information bits and an additional number of bits;
means for identifying allocated information bit channels according to the fractally enhanced kernel polar code construction and the aggregate number of information bits;
means for removing a number of allocated information bit channels from the identified allocated information bit channels to obtain a final set of allocated information bit channels, wherein the number of removed allocated information bit channels is equal to the additional number of bits; and
means for decoding the plurality of encoded information bits based at least in part on the final set of allocated information bit channels.

31. An apparatus for wireless communication, comprising:
a processor;
memory in electronic communication with the processor; and
instructions stored in the memory and executable by the processor to cause the apparatus to:
identify a plurality of information bits comprising a number of bits for encoding;
determine an aggregate number of information bits for fractally enhanced kernel polar code construction, wherein the aggregate number of information bits is equal to a sum of the number of bits for encoding and an additional number of bits;
allocate a total number of information bit channels according to the fractally enhanced kernel polar code construction and the aggregate number of information bits;
remove a number of allocated information bit channels from the total number of information bit channels to obtain a final set of allocated information bit channels, wherein the number of removed allocated information bit channels is equal to the additional number of bits;
generate a polar-encoded codeword based at least in part on assigning the plurality of information bits to the final set of allocated information bit channels; and
transmit the polar-encoded codeword.

32. The apparatus of claim 31, wherein the instructions are further executable by the processor to cause the apparatus to:
identify a block length for the fractally enhanced kernel polar code construction; and
determine a length of the polar-encoded codeword based at least in part on the block length.

33. The apparatus of claim 32, wherein the instructions are further executable by the processor to cause the apparatus to:
puncture one or more bits based at least in part on the block length and the length of the polar-encoded codeword.

34. The apparatus of any of claim 32 or 33, wherein the instructions to allocate the total number of information bit channels are executable by the processor to cause the apparatus to:
recursively split the length of the polar-encoded codeword into a plurality of sub-blocks;
assign information bits of the aggregate number of information bits to the plurality of sub-blocks based at least in part on mutual information metrics; and
allocate the total number of information bit channels based at least in part on a number of information bits assigned to each sub-block of the plurality of sub-blocks.

35. The apparatus of claim 34, wherein the instructions are further executable by the processor to cause the apparatus to:
divide the plurality of sub-blocks into a first portion of sub-blocks and a second portion of sub-blocks, wherein the number of allocated information bit channels are removed from the first portion of sub-blocks.

36. The apparatus of claim 35, wherein the instructions are further executable by the processor to cause the apparatus to:
puncture one or more bits from the first portion of sub-blocks, wherein the number of allocated information bit channels are removed from the first portion of sub-blocks based at least in part on the puncturing.

37. The apparatus of any of claim 35 or 36, wherein the instructions are further executable by the processor to cause the apparatus to:
calculate an average number of bit channels to remove based at least in part on the additional number of bits and a number of sub-blocks in the first portion of sub-blocks, wherein the number of allocated information bit channels are removed from the first portion of sub-blocks based at least in part on the average number of bit channels to remove.

38. The apparatus of any of claims 35-37, wherein the instructions are further executable by the processor to cause the apparatus to:
refrain from removing a last allocated information bit channel from a sub-block.

39. The apparatus of any of claims 35-38, wherein the first portion of sub-blocks is a first half of the plurality of sub-blocks and the second portion of sub-blocks is a second half of the plurality of sub-blocks.

40. The apparatus of any of claims 34-39, wherein the instructions are further executable by the processor to cause the apparatus to:
halt the recursive splitting when a sub-block length of each sub-block is less than or equal to a threshold sub-block length.

41. The apparatus of claim 40, wherein each sub-block of the threshold sub-block length comprises a pre-determined bit channel reliability order, and wherein the instructions to generate the polar-encoded codeword are executable by the processor to cause the apparatus to:
assign the plurality of information bits based at least in part on the pre-determined bit channel reliability order and the number of information bits assigned to each sub-block of the plurality of sub-blocks.

42. The apparatus of any of claims 32-41, wherein the instructions are further executable by the processor to cause the apparatus to:
select the additional number of bits based at least in part on a bit selection function.

43. The apparatus of claim 42, wherein the bit selection function is based at least in part on the block length, the length of the polar-encoded codeword, a number of punctured bits, or a combination thereof.

44. The apparatus of any of claims 31-43, wherein removing the number of allocated information bit channels is based at least in part on channel capacity values, error probability values, or a combination thereof.

45. An apparatus for wireless communication, comprising:
a processor;
memory in electronic communication with the processor; and
instructions stored in the memory and executable by the processor to cause the apparatus to:
receive a polar-encoded codeword comprising a plurality of encoded information bits, the polar-encoded codeword generated based at least in part on a fractally enhanced kernel polar code construction; and
perform a decoding process on the polar-encoded codeword, the decoding process comprising instructions executable by the processor to cause the apparatus to:
determine an aggregate number of information bits, wherein the aggregate number of information bits is equal to a sum of a number of bits of the plurality of encoded information bits and an additional number of bits;
identify allocated information bit channels according to the fractally enhanced kernel polar code construction and the aggregate number of information bits;
remove a number of allocated information bit channels from the identified allocated information bit channels to obtain a final set of allocated information bit channels, wherein the number of removed allocated information bit channels is equal to the additional number of bits; and
decode the plurality of encoded information bits based at least in part on the final set of allocated information bit channels.

46. The apparatus of claim 45, wherein the instructions are further executable by the processor to cause the apparatus to:
identify a block length for the fractally enhanced kernel polar code construction and a length of the polar-encoded codeword.

47. The apparatus of claim 46, wherein the instructions are further executable by the processor to cause the apparatus to:
determine a number of punctured bits based at least in part on the block length and the length of the polar-encoded codeword.

48. The apparatus of any of claim 46 or 47, wherein the instructions are further executable by the processor to cause the apparatus to:
determine the additional number of bits based at least in part on a bit selection function.

49. The apparatus of claim 48, wherein the bit selection function is based at least in part on the block length, the length of the polar-encoded codeword, a number of punctured bits, or a combination thereof.

50. The apparatus of any of claims 45-49, wherein the instructions to identify the allocated information bit channels are executable by the processor to cause the apparatus to:
recursively split a length of the polar-encoded codeword into a plurality of sub-blocks;
determine assignments of information bits of the aggregate number of information bits to the plurality of sub-blocks based at least in part on mutual information metrics; and
identify the allocated information bit channels based at least in part on a number of information bits assigned to each sub-block of the plurality of sub-blocks.

51. The apparatus of claim 50, wherein the instructions are further executable by the processor to cause the apparatus to:
divide the plurality of sub-blocks into a first portion of sub-blocks and a second portion of sub-blocks, wherein the number of allocated information bit channels are removed from the first portion of sub-blocks.

52. The apparatus of claim 51, wherein the instructions are further executable by the processor to cause the apparatus to:
identify a set of punctured bits in the first portion of sub-blocks, wherein the number of allocated information bit channels are removed from the first portion of sub-blocks based at least in part on the identified set of punctured bits.

53. The apparatus of any of claim 51 or 52, wherein the instructions are further executable by the processor to cause the apparatus to:
calculate an average number of bit channels to remove based at least in part on the additional number of bits and a number of sub-blocks in the first portion of sub-blocks, wherein the number of allocated information bit channels are removed from the first portion of sub-blocks based at least in part on the average number of bit channels to remove.

54. The apparatus of any of claims 51-53, wherein the instructions are further executable by the processor to cause the apparatus to:
refrain from removing a last allocated information bit channel from a sub-block.

55. The apparatus of any of claims 51-54, wherein the first portion of sub-blocks is a first half of the plurality of sub-blocks and the second portion of sub-blocks is a second half of the plurality of sub-blocks.

56. The apparatus of any of claims 50-55, wherein the instructions are further executable by the processor to cause the apparatus to:
halt the recursive splitting when a sub-block length of each sub-block is less than or equal to a threshold sub-block length.

57. The apparatus of claim 56, wherein each sub-block of the threshold sub-block length comprises a pre-determined bit channel reliability order, and wherein the instructions to decode the plurality of encoded information bits are executable by the processor to cause the apparatus to:

determine assignments for the plurality of encoded information bits based at least in part on the pre-determined bit channel reliability order and the number of information bits assigned to each sub-block of the plurality of sub-blocks.

58. The apparatus of any of claims 45-57, wherein removing the number of allocated information bit channels is based at least in part on channel capacity values, error probability values, or a combination thereof.

59. A non-transitory computer-readable medium storing code for wireless communication, the code comprising instructions executable by a processor to:
- identify a plurality of information bits comprising a number of bits for encoding;
- determine an aggregate number of information bits for fractally enhanced kernel polar code construction, wherein the aggregate number of information bits is equal to a sum of the number of bits for encoding and an additional number of bits;
- allocate a total number of information bit channels according to the fractally enhanced kernel polar code construction and the aggregate number of information bits;
- remove a number of allocated information bit channels from the total number of information bit channels to obtain a final set of allocated information bit channels, wherein the number of removed allocated information bit channels is equal to the additional number of bits;
- generate a polar-encoded codeword based at least in part on assigning the plurality of information bits to the final set of allocated information bit channels; and
- transmit the polar-encoded codeword.

60. A non-transitory computer-readable medium storing code for wireless communication, the code comprising instructions executable by a processor to:
- receive a polar-encoded codeword comprising a plurality of encoded information bits, the polar-encoded codeword generated based at least in part on a fractally enhanced kernel polar code construction; and
- perform a decoding process on the polar-encoded codeword, the decoding process comprising instructions executable by the processor to:
  - determine an aggregate number of information bits, wherein the aggregate number of information bits is equal to a sum of a number of bits of the plurality of encoded information bits and an additional number of bits;
  - identify allocated information bit channels according to the fractally enhanced kernel polar code construction and the aggregate number of information bits;
  - remove a number of allocated information bit channels from the identified allocated information bit channels to obtain a final set of allocated information bit channels, wherein the number of removed allocated information bit channels is equal to the additional number of bits; and
  - decode the plurality of encoded information bits based at least in part on the final set of allocated information bit channels.

* * * * *